US006172593B1

(12) United States Patent
Mochida et al.

(10) Patent No.: US 6,172,593 B1
(45) **Date of Patent: *Jan. 9, 2001**

(54) ELECTRONIC COMPONENT

(75) Inventors: Norihiro Mochida; Yoshihiro Yamada; Haruo Takahata, all of Nagaokakyo (JP)

(73) Assignee: Murata Manufacturing Co., Ltd., Nagaokakyo (JP)

( * ) Notice: Under 35 U.S.C. 154(b), the term of this patent shall be extended for 0 days.

This patent is subject to a terminal disclaimer.

(21) Appl. No.: 09/356,417

(22) Filed: Jul. 16, 1999

Related U.S. Application Data

(62) Division of application No. 08/724,279, filed on Oct. 1, 1996, now Pat. No. 5,963,125.

(30) Foreign Application Priority Data

Nov. 7, 1995 (JP) .................................................. 7-288798
May 10, 1996 (JP) .................................................. 8-116129

(51) Int. Cl.[7] ...................................................... H01L 7/10
(52) U.S. Cl. ...................... 338/22 R; 338/316; 338/232; 338/234; 338/22 SD
(58) Field of Search ............................ 338/22 R, 22 SD, 338/54, 57, 232, 234, 235, 236, 237, 277, 316, 318; 174/52.6; 257/688; 361/807

(56) References Cited

U.S. PATENT DOCUMENTS 4,822,980 4/1989 Carbone et al. .
4,924,204 5/1990 Uchida .
5,117,089 5/1992 Honkomp et al. .
5,142,265 8/1992 Motoyoshi et al. .
5,606,302 2/1997 Ichida .
5,963,125 * 10/1999 Mochida et al. .................. 338/22 R

FOREIGN PATENT DOCUMENTS 38 39 868 6/1989 (DE) .
196 38 631 4/1998 (DE) .
0 618 594 10/1994 (EP) .
2 002 176 2/1979 (GB) .
4-78102 3/1992 (JP) .
4-78103 3/1992 (JP) .
5-299206 11/1993 (JP) .
9-92506 4/1997 (JP) .
WO 95/10115 4/1995 (WO) .

* cited by examiner

*Primary Examiner*—Karl D. Easthom
(74) *Attorney, Agent, or Firm*—Burns, Doane, Swecker & Mathis, LLP

(57) ABSTRACT

A positive thermistor device includes a positive thermistor element having a pair of opposed electrodes, each of which receives compressive force elastically applied from a corresponding one of spring contact members to hold the thermistor element at a predefined position in the device. When the thermistor device is destroyed, the element breaks into fragments, some of which remain in contact with the spring contact members. The remaining fragments deviate in position to ensure that they do not conduct electricity, resulting in an open state, wherein any current flow is inhibited through such fragments. More specifically, a positive thermistor disk is held within the device so that it is interposed between conductive spring contact pieces and insulative position-alignment projections, which are cross-diagonally situated with respect to each other. The spring contact pieces are located further toward the periphery of the disk than the position-alignment projections, causing a spring force to extend in a direction generally outward relative to a direction perpendicular to the planes of the electrodes. In one embodiment, the position-alignment projections have cut-away portions at outer tip ends thereof respectively to further promote the formation of an open circuit state upon the occurrence of malfunction.

6 Claims, 20 Drawing Sheets

ELECTRONIC COMPONENT

This application is a divisional of Application Ser. No. 08/724,279, field Oct. 1, 1996 now U.S. Pat. No. 5,963,125.

BACKGROUND OF THE INVENTION

1. Field of the Invention

The present invention relates generally to electronic devices employing therein an electronic element with opposite electrodes on its principal planes, and more particularly, to electronic modules with an elastic support mechanism for an electronic element mounted therein having spring contact pieces in contact with respective electrodes of the electronic element for elastic support of the element as interposed therebetween.

2. Description of the Prior Art

Conventionally, many electronic devices include positive thermistor devices for use in current limiter circuitry. Thus, thermistor devices have been widely used in the manufacture of several types of electric circuitry or modules, including motor activation controller circuitry for electric refrigerators, electronic demagnetization circuitry for television receivers, monitor display tube units, and other applications.

One typical configuration of a prior art positive thermistor device is shown in FIGS. 13 and 14, wherein this device is generally designated by the numeral 1. This conventional positive thermistor device I essentially consists of a casing body or base 3, a positive thermistor element 4 held therein, a pair of first and second terminal members 5, 6, and a lid or cover 2 attached to the base 3 to close the upper opening thereof.

As shown, the positive thermistor element 4 exhibits a disk-like shape having opposite surfaces on which first and second electrodes 7, 8 are disposed respectively. This positive thermistor element 4 is centrally inserted into the inside space of the base 3, with the electrodes 7, 8 facing the right and left sides thereof, as shown in FIG. 14.

The first and second terminal members 5, 6 are assembled within the inside space of casing base 3 in such a way that these members 5, 6 support both sides of the opposed electrodes 7, 8 of the positive thermistor element 4. Each terminal member 5, 6 may be an elastic conductive plate of a chosen metallic material. The first terminal member 5 includes a pair of spring contact pieces 9, 10 having a W-shaped profile as a whole, and also a hollow tube socket 11 with a longitudinal gap for receiving therein a known connector pin (not shown) associated therewith to provide electrical connection therebetween. A wave shaped plate constituting the W-shaped spring contact pieces 9, 10 and the socket 11 may be integrally formed in the terminal member 5 by known welding or caulking techniques. The second terminal member 6 is similar in structure to the first terminal 5; it has W-shaped spring contact pieces 12, 13 and connector-pin socket 14.

After assembly within the casing base 3, the spring contact pieces 9, 10 of the first terminal member 5 serve to apply compressive force onto the first electrode 7 due to its inherent elastic nature. Similarly, the spring contact pieces 12, 13 of the second terminal member 6 apply compressive force to the second electrode 8. This may enable the positive thermistor element 4 to be elastically supported or suspended between the terminal members 5, 6 while the element 4 is interposed between one pair of spring contact pieces 9, 10 and the other pair of contact pieces 12, 13.

Additionally, a mica plate 15 may be disposed around the outer periphery of the positive thermistor element 4. This mica plate 15 exhibits a circular shape. When engaged with the outer periphery of thermistor element 4, this plate 15 acts to facilitate appropriate positioning (hereinafter referred to as "position-determination") of thermistor 4 inside base 3.

After the positive thermistor element 4 and terminal members 5, 6 are assembled within the casing base 3, the cover 2 is attached thereto so that it closes the upper opening of the casing body 3. This cover 2 is a rectangular plate member having at its two corresponding corners two holes 16, 17 to permit insertion of external connector pins into the sockets 11, 14 through these holes respectively.

Another prior known positive thermistor device 1*a* is shown in FIGS. 16 to 18. As is readily seen by comparison of the illustration of FIG. 16 to that of FIG. 14, this prior art device is similar in structure to the previous device; accordingly, like reference characters are used to designate like parts or components with a redundant explanation thereof being omitted herein.

As can be seen from FIG. 16, the positive thermistor device 1*a* is structurally different from that of FIG. 14 to the extent that a first terminal member 5*a* has a W-shaped pair of spring contact pieces 9*a,* 10*a* extending vertically, rather than horizontally as in the previous prior art device 1, best shown in FIG. 14, thereby preventing these contact pieces 9*a,* 10*a* from directly opposing their associated spring contact pieces 12, 13 of the other, second terminal member 6. Such vertical facing relation of spring contact pieces 9*a*, 10*a* versus the opposite spring contact pieces 12, may also be seen in FIGS. 17 and 18. FIGS. 17 and 18 show a plan view and side view, respectively, of the device shown in FIG. 16.

With the prior art positive thermistor devices 1, 1*a,* after a long time has elapsed after installation thereof, the structure of the positive thermistor element 4 may become physically degraded. If this is the case, abnormal heat generation may take place therein causing sparks to occur during operation, which results in the positive thermistor element 4 being destroyed due to occurrence of such sparks. When the thermistor element 4 is destroyed, it breaks into several fragments that can disperse within the closed inside space as defined by the casing base 3 and cover 2 attached thereto.

Such a "malfunction mode" phenomenon can lead to a more serious malfunction mode, which will be discussed in more detail below with reference to FIGS. 15A and 15B for the positive thermistor device of FIGS. 13 and 14, and with reference to FIGS. 19 to 21 for the device la shown in FIGS. 16 to 18, respectively.

In the positive thermistor device 1 of FIGS. 13 and 14, when sparks occur, the resulting positive thermistor element 4 experiences occurrence of several cracks 18 therein, as shown in FIG. 15A. Even under such a condition, specific cracked portions 19, each of which is elastically supported by the opposed spring contact pieces 9, 10 (or 12, 13) at its opposite sides, continue to stably be held there at as shown in FIG. 15B, while the remaining fragments disperse. Accordingly, a power supply may continuously be fed by way of such residual components 19 of the thermistor element 4, causing these residual components 19 and their associative spring contact pieces 9, 10, 12, 13 to melt, in turn producing an alloy that exhibits some conductivity. As a result, an electrical short can be formed between the terminal members 5, 6. This adversely serves to accelerate further generation of abnormal heat. This will possibly force the device to go into a further malfunction mode which can, in turn, lead to unwanted softening of the casing base 3.

Furthermore, in the positive thermistor device 1, since the mica plate 15 is arranged therein, certain peripheral portions 20 of the positive thermistor element 4 which are directly in contact with the mica plate 15 tend to also be prevented from flying away as fragments, in most cases. Such peripheral portions 20 also contribute to the formation of alloy together with the aforementioned portions 19 being elastically supported by spring contact pieces 9, 10, 12, 13, with the result of increasing the amount of materials for producing the alloy. This may exacerbate the malfunction of the device, which may cause the softening of base 3 to become more serious.

On the other hand, in the positive thermistor device la shown in FIGS. 16 to 18, the positive thermistor element 4 experiences occurrence of cracks 21 due to generation of sparks, as shown in FIG. 20A. In this case, the thermistor element 4 is broken into several fragments that tend to disperse. At this time, since the spring contact pieces 9*a*, 10*a* and their opposed contact pieces 12, 13 are not identical to each other in a spring-force application direction, any dispersed fragments will be positionally offset from their original positions. However, since the distance 22 between a respective one of the spring contact pieces 9*a*, 10*a* and a corresponding one of opposed spring contact pieces 12, 13 associated therewith is designed so that the distance is less than the thickness 23 of the positive thermistor element 4 in a free state where the element 4 is removed as shown in FIG. 19, one part 24 thereof will possibly be held at its original position as a result of the fact that it happens to be gripped or hung between the spring contact piece 9*a* and/or 10*a* on one hand and elements 12 and/or 13 on the other hand, as shown in FIGS. 20A and 20B. If this is the case, application of a power supply may continue via such a hung portion 24 causing, in a similar way as in the previous device 1, this portion 24 and any one of contact pieces 9*a*, 10*a*, 12, 13 to melt, in turn producing an alloy, whereby the terminal members 5*a*, 6 are electrically shorted therebetween so that abnormal heat generation is accelerated. This, in turn, may lead to a further serious malfunction mode where the casing base 3 is softened undesirably. Regarding the presence of the mica plate 15, the previous discussions may also be true for this device 1*a*. Namely, in the positive thermistor device 1*a*, since the mica plate 15 is arranged therein, certain peripheral portions 25 of the positive thermistor element 4 which are directly in contact with the mica plate 15 are prevented from flying away as fragments in most cases, as shown in FIG. 20B, in a similar manner as in the above positive thermistor device 1. Such peripheral portions 25 also give rise to generation of an alloy, which adds to the amount of material for producing the alloy. This may serve to worsen the malfunction mode of the device, causing a softening of base 3 to become more serious.

The aforesaid problems will not exclusively arise with positive thermistor devices, and will possibly take place in other types of electronic components or devices, insofar as these other types of components employ therein an electronic element that is electrically fed and elastically supported by using similar contact members associated therewith, which element is susceptible to degradation and eventual destruction due to long use.

SUMMARY OF THE INVENTION

It is therefore an object of the present invention to provide a new and improved electronic device capable of avoiding the problems encountered with the prior art.

It is another object of the invention to provide an improved electronic module capable of attaining high reliability in operation even when destruction takes place at an electronic element packed therein.

It is a further object of the invention to provide an improved electronic module capable of assuring higher operational reliability upon occurrence of destruction of its internal electronic element packed therein by providing enhanced isolation among fragments even after physical destruction of the element.

To attain the foregoing objects, the present invention provides an electronic device which includes an electronic element having first and second opposed electrodes, and a support structure for elastically supporting the electronic element, wherein the support structure specifically includes first and second contact sections in contact with the first electrode at different positions thereon, and third and fourth contact sections in contact with the second electrode at different positions thereon. The first and fourth contact sections are located closer to the outer peripheral portions of the first and second electrodes than the third and second contact sections, whereas the first and fourth contact sections are electrically connected with the first and second electrodes respectively to provide a conductive path for application of power supply to the electronic element. The second and third contact sections are electrically isolated from the first and second electrodes.

In accordance with the principles of the invention, several different embodiments are described herein.

In accordance with one aspect of the invention, the support structure includes a first conductive terminal member having first and second spring contact pieces for elastically applying compressive force to the first electrode, a second conductive terminal member having third and fourth spring contact pieces for elastically applying compressive force to the second electrode, a first insulative member interposed between the second spring contact piece and the first electrode, and a second insulative member interposed between the third spring contact piece and the second electrode, wherein the first spring contact piece, the first insulative member, the second insulative member and the fourth spring, contact piece correspond to the first to fourth contact sections respectively.

In accordance with another aspect of the invention, the support structure includes a first conductive terminal member having a first spring contact piece for elastically applying compressive force to the first electrode, a first insulative member in contact with the first electrode, a second insulative member in contact with the second electrode, and a second conductive terminal member having a second spring contact piece for elastically applying compressive force toward the second electrode, wherein the first spring contact piece, first insulative member, second insulative member and second spring contact piece may correspond to the first to fourth contact sections respectively.

The electronic device may further include a casing structure for holding therein the electronic element and the first and second terminal members, wherein the first and second insulative members are associated with the casing.

With such an arrangement, when the electronic element is accidentally destroyed due to degradation through long use, respective residual fragments that are elastically supported by both the first and fourth contact sections and by the second and third sections are acted upon by these contact sections so that such portions may be forced in the condition where the principal plane of the electronic element is deviated in position. Furthermore, these residual portions remain interposed either between the first contact section being rendered electrically conductive and the third contact section rendered insulative, or between the fourth contact section rendered electrically conductive and the second contact section rendered insulative. This eliminates any current flow therethrough, enabling the resulting circuitry to be forced into the open state.

In accordance with yet another aspect of the invention, an electronic module includes an electronic element having first and second principal planes opposed along a thickness dimension thereof, and first and second electrodes formed on the first and second principal planes respectively, a pair of a first conductive spring contact piece and a first insulative position-alignment projection in contact with the first principal plane at different positions thereon, and a pair of a second conductive spring contact piece and a second insulative position-alignment projection in contact with the second principal plane at different positions thereon. The first and second spring contact pieces are elastically in contact with the first and second electrodes respectively, while providing an electrical conductive state therebetween. The first spring contact piece is located closer to the outer periphery of the electronic element than the second position-alignment projection, while causing the first spring contact piece to oppose the second position alignment projection, with the electronic element being interposed therebetween. The second spring contact piece is located closer to the outer periphery of the electronic element than the first position-alignment projection, while causing the second spring contact piece to oppose the first position alignment projection, with the electronic element being interposed therebetween.

In the above structure, a significant exemplary feature of the invention is that each of the first and second spring contact pieces defines a spring force having a direction generally directed outward relative to a direction which is perpendicular to the principal planes (which is henceforth referred to as the "direction of thickness of the electronic element"). In other words, the structure of the electrical device forces fragments outward toward the peripheral portions of the electronic element.

Another significant feature of the invention is that each of the first and second position-alignment projections has a tip end being partly cut away at its outer side facing the outer periphery of the electronic element.

It should be noted that any number of the above features may also be structurally combined together.

Preferably, the electronic module embodying the invention may further include a housing or casing for holding therein the electronic element and the first and second spring contact pieces, while the first and second position-alignment projections are associated with this casing.

Additionally, the principles of the invention may advantageously be applied to the manufacture of electronic devices or modules employing therein a positive thermistor element as an internal electronic element, the modules being also known as positive thermistor devices.

A significant advantage of the invention is that even when the electronic element inside the device is accidentally cracked to induce physical destruction during operation, any continuous flow of abnormal current therein can be successfully suppressed or eliminated by forcing the destroyed electronic element to be in the open state immediately after such an accident, thereby ensuring that maximized safety is guaranteed.

More specifically, the electronic device includes an elastic support mechanism for elastically supporting or suspending the internal electronic element inside the device, which mechanism includes a plurality of pairs of spring contact pieces and position-determination projections. While all of these pieces and projections cause the element to be interposed between each contact and its corresponding projection on the opposite side of the element, only spring contact pieces contribute to formation of an electrically conductive path for power supply of the element, whereas the projections are merely mechanically in contact with the element for position-determination thereof. In other words, looking at each pair of contact piece and projection on the opposite sides of the element for support thereof, only one of them is electrically coupled to the element while the other remains insulated from it. Accordingly, when the element is cracked and destroyed into fragments due to the degradation of its material, even if some of the fragments attempt to remain at their original positions due to application of elastic or compressive forces from a corresponding contact piece-projection pair, a conductive path will no longer be defined for each residual fragment because of the fact that one of its associated support members (namely, the projection) must be an electrical insulator, which acts to interrupt or cut off any possible continuous flow of current through the fragment(s). This can ensure that the electronic element being presently destroyed is in the open state with respect to any one of such residual fragments, if any. Therefore, it is possible to reliably eliminate unwanted transition of the element into more dangerous malfunction states otherwise occurring in such a way that residual fragments and spring contact pieces adversely cooperate to induce undesired alloying phenomenon, creating electrical short-circuiting that accelerates further generation of abnormal heat in the element destroyed.

Another significant advantage of the invention is that safety can be much enhanced upon occurrence of destruction of the element due to the fact that the elastic support mechanism is specifically arranged so as to force adjacent ones of residual fragments to become spaced apart from each other, thereby minimizing the possibility of shorting between the elements. This can advantageously serve to prevent current flowing between adjacent ones of fragments inside the casing structure.

A further advantage of the invention is that the aforesaid safety enhancement features also serve to allow the casing structure to be constituted from resin material, thus reducing cost and structural complexity, while eliminating softening thereof otherwise arising upon receipt of abnormal heat due to continuous flow of abnormal current after destruction of the element. The advantages may typically become more significant when the invention is applied to positive thermistor devices.

These and other objects, features and advantages of the invention will be apparent from the following more particular description of preferred embodiments as illustrated in the several figures of the drawings.

DETAILED DESCRIPTION OF THE INVENTION

Figure 1:
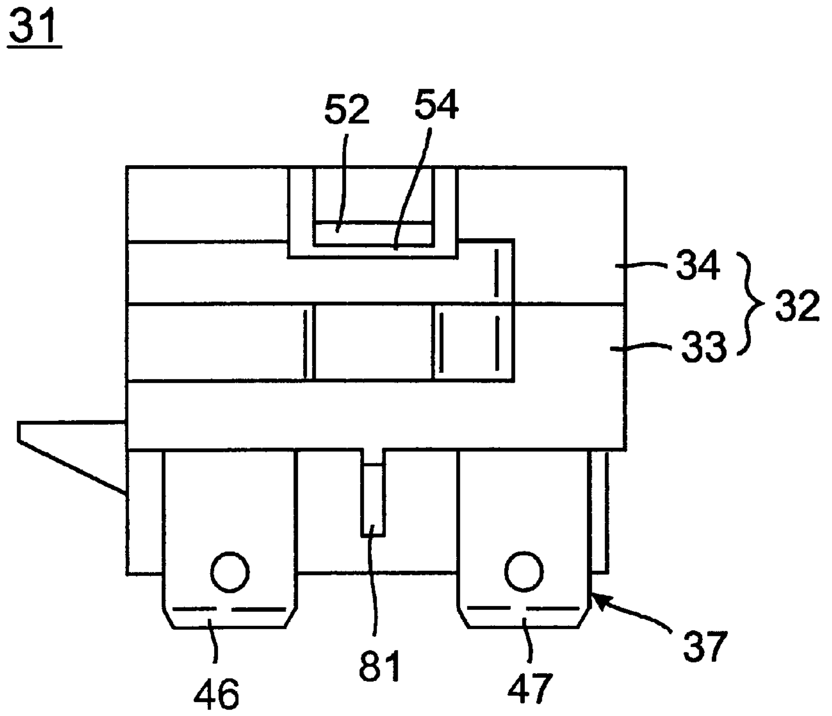
FIG. 1 is a front view of a positive thermistor device in accordance with one embodiment of the invention.
Figure 2:
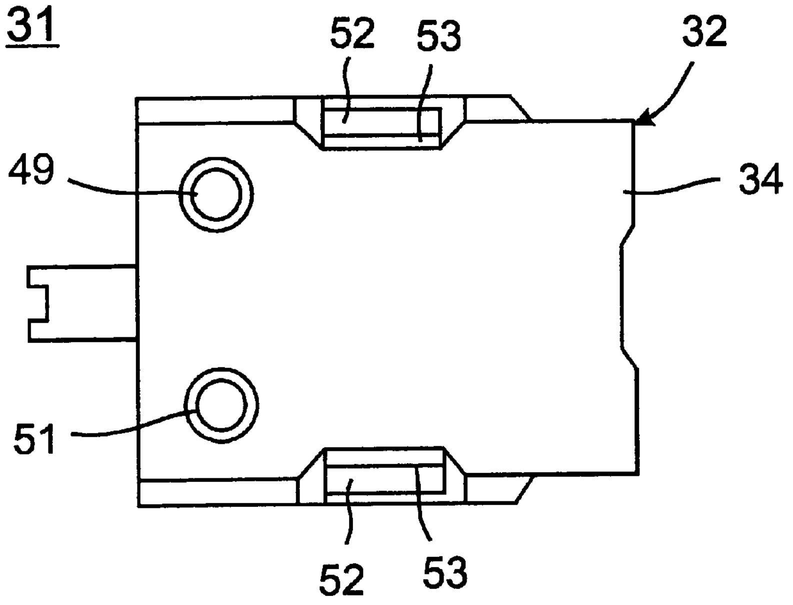
FIG. 2 is a plan view of the positive thermistor device shown in FIG. 1.
Figure 3:
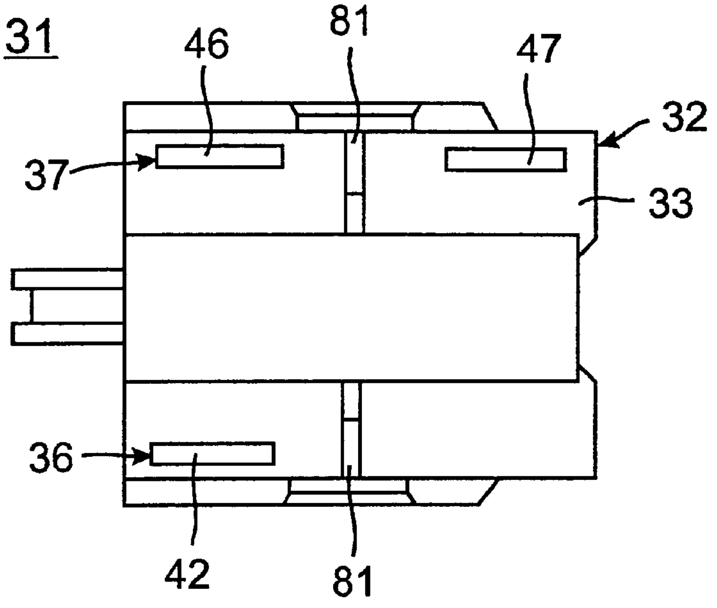
FIG. 3 is a bottom view of the positive thermistor device of FIG. 1.
Figure 4:
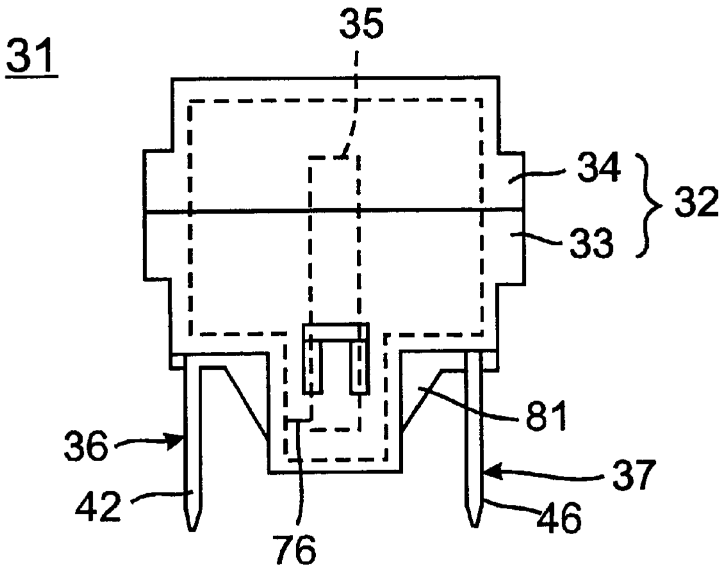
FIG. 4 is a left side view of the positive thermistor device of FIG. 1.
Figure 5:
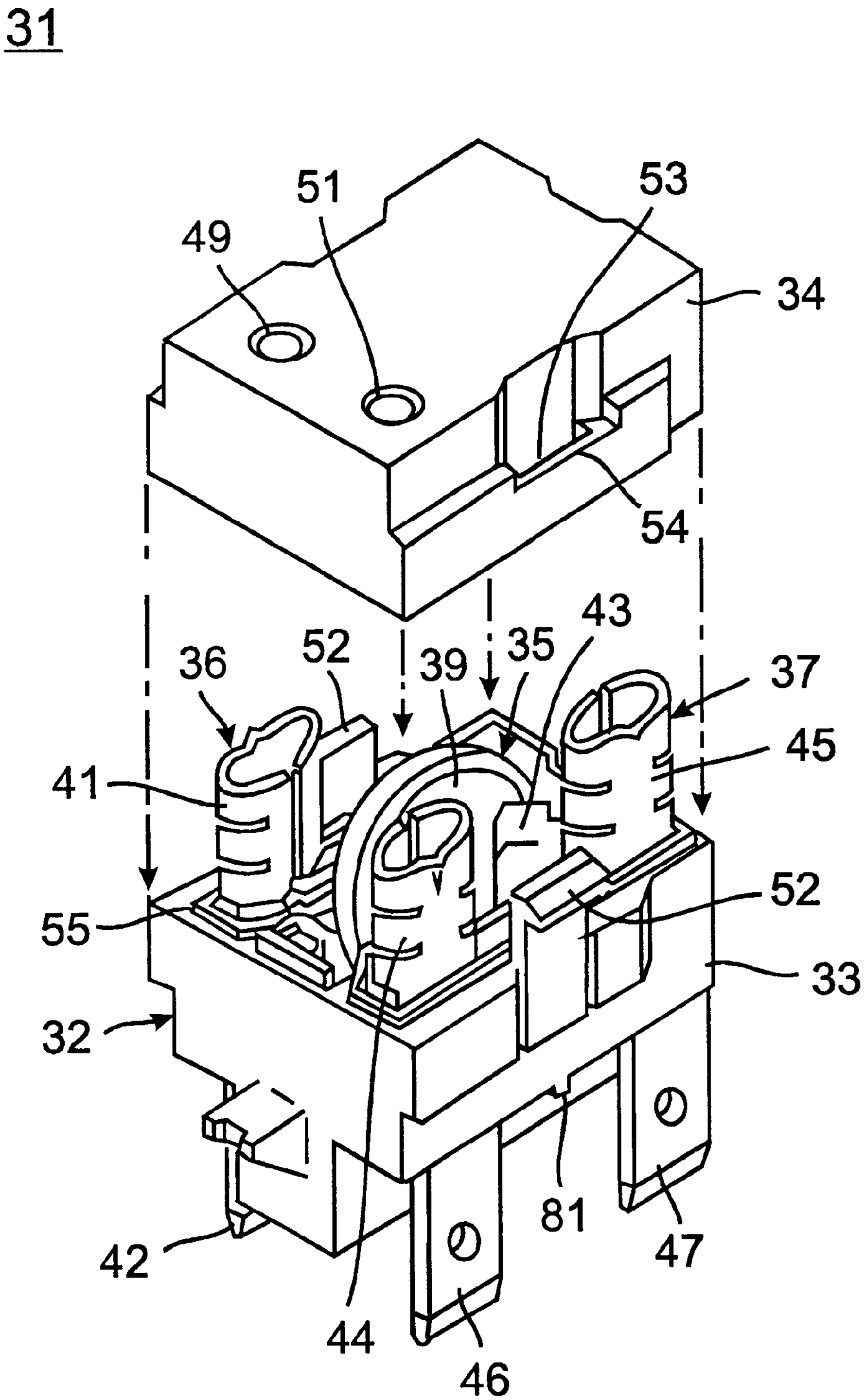
FIG. 5 is a perspective view of the positive thermistor device showing a casing cover as separated from the remaining parts thereof to visually reveal the inside structure of the device.

A positive thermistor device in accordance with one embodiment of the present invention is generally designated by the numeral 31 as shown in FIGS. 1 through 12. Referring to FIG. 1, the positive thermistor device 31 has a casing structure 32 consisting of a base 33 and a lid or cover member 34. The thermistor device 31 includes a positive thermistor element 35 as held therein, and a pair of terminal members 36, 37, one of which is shown in FIG. 1, and both of which are visible in FIG. 3, for example. A perspective view of the resulting assembly is best illustrated in FIG. 5.

The casing base 33 and its cover 34 are made of a chosen heat-resistant incombustible material that offers incombustibility equivalent to the level “94V-0” of the UL standards, such as phenol, polyphenylenesulfite, polybutylene terephthalate, or the like. The base 33 is structured to have a projection on the bottom thereof enabling the positive thermistor element 35 to be stably held therein. As will be discussed in detail below, the base 33 and cover 34 may be provided with several configurations for enabling precise position-determination or alignment of the positive thermistor element 35 and terminal members 36, 37 once assembled thereto.

The positive thermistor element 35 may be made of a chosen ceramic-like semiconductor material with Curie temperature of approximately 130° C, which is formed into a coin- or disk-like shape. This disk-like positive thermistor element 35 has first and second principal planes on the opposite sides thereof, on which two, first and second electrodes 38, 39, are formed respectively. These electrodes 38, 39 may be a lamination of an underlying nickel (Ni) layer and an overlying silver (Ag) layer. Preferably, the underlying layer is exposed at the periphery of the overlying layer for elimination of unwanted migration of Ag material. Note that the positive thermistor disk 35 may alternatively be formed into another shape, including rectangular plate, bead, or rod. The two-terminal positive thermistor disk 35 is vertically inserted centrally into the inside space of the base 33 with its electrodes 38, 39 laterally facing each other.

As shown in FIG. 5, the first and second terminal members 36, 37 are also packed into the base 33 in such a manner that the positive thermistor disk 35 is interposed therebetween. These terminals 36, 37 are made of a chosen metallic material with excellent conductivity.

Figure 6:
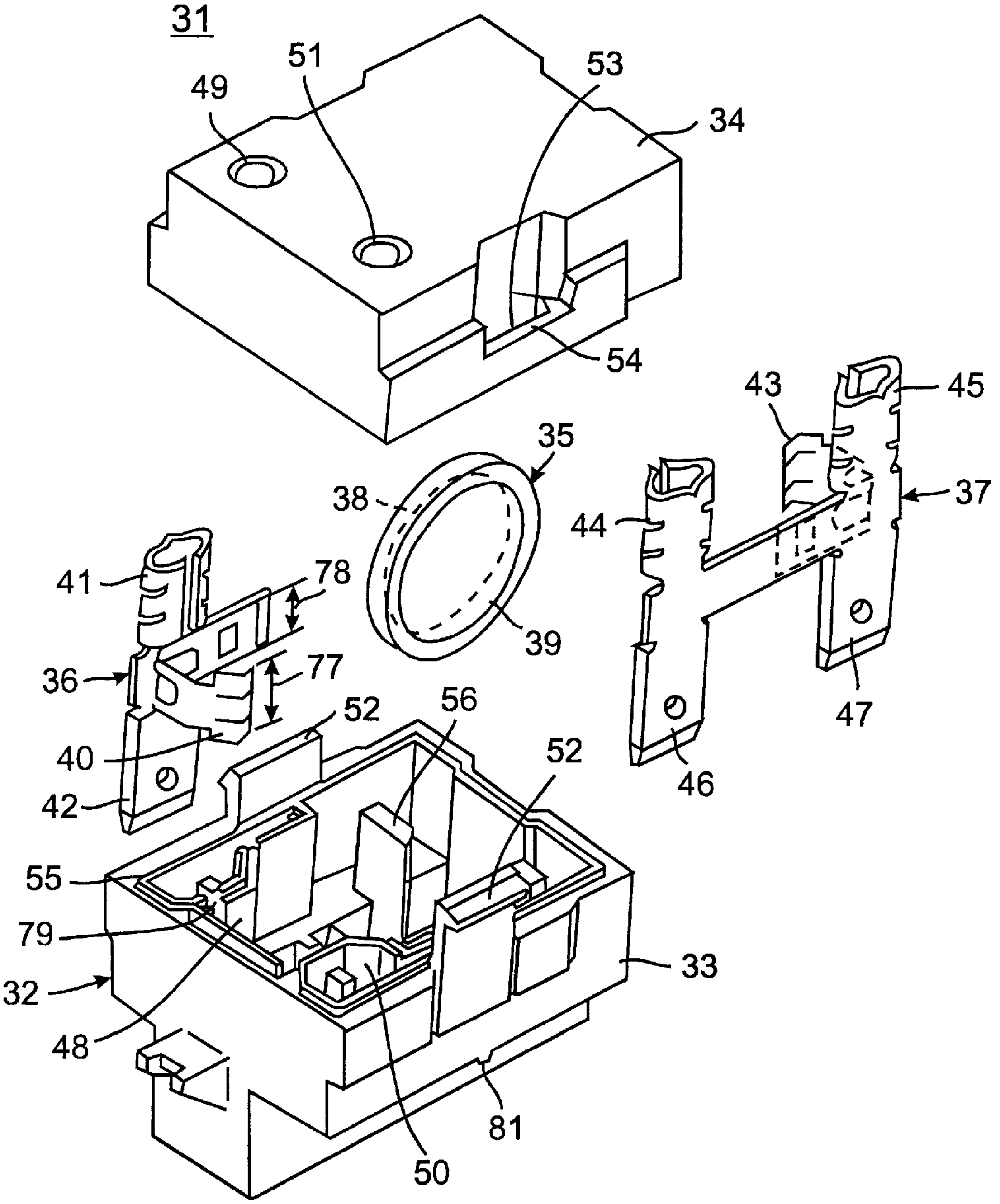
FIG. 6 illustrates in an exploded manner several parts assembled in the positive thermistor device of FIG. 1.

More specifically, as better seen from an exploded perspective view depicted in FIG. 6, the first terminal member 36 has a spring contact piece 40 made of a thin folded metal plate, and a conductive side-slit hollow tube socket 41 that receives a known external connector pin (not shown) to provide electrical interconnection therebetween. The first terminal 36 also has a downward extending fastener edge 42 for rigid insertion into a corresponding receptacle of the base 33. In the embodiment shown in FIGS. 1 to 12, thin metal plates for the spring contact piece 40 and pin socket 41 are separately prepared and later assembled together by known welding or caulking techniques into an integral terminal component. The metal plate for spring contact piece 40 may be a copper-titanium (Cu—Ti) base plate with a Ni overcoat as formed by metal plating techniques. The metal plate of socket 41 may be a Cu—Ni plate.

As best shown in FIG. 6, the second terminal member 37 is constituted from an H-shaped plate structure that consists of a spring contact piece 43, a pair of connector-pin sockets 44 at the top portions of the "poles" of the H-shape, 45 and a pair of downward extending fastener edges 46, 47 at the bottoms of such poles of the H-shape. This H-shaped two-pin terminal 37 is similar to the first terminal 36 in material and in manufacture.

Once assembled, the first terminal member 36 (for purposes of convenience, this one-pin terminal 36 will be referred to as the "I-shaped" terminal hereinafter due to the fact that it has only one upward extending pole as a whole, to facilitate distinguishing over the two-pin terminal 37) is position-determined by a wall 48 inside the base 33 as shown in FIG. 6, causing its fastener edge 42 to vertically project out of the outer surface of base 33, as can be seen from the illustration of FIG. 5, for electrical connection with any external circuitry operatively associated therewith. To permit insertion of an external connector pin (not shown) into the socket 41 of the I-shaped terminal 36, the casing cover 34 has a corresponding hole or opening 49 therein.

Likewise, the assembled H-shaped terminal 37 is position-determined by another wall 50 inside the base 33, while allowing its fastener edges 46, 47 to externally project downward from the base 33, as shown in FIG. 5, for providing electrical connection with external circuitry. The cover 34 has therein a hole or opening 51 also, for permitting an associative contact pin to externally penetrate therethrough to mate with a selected one of the sockets 44, 45. Note here that the cover 34 has no opening for the remaining nonselected socket (here, socket 45) simply because it remains unused in the illustrative embodiment. In this respect, this socket 45 may be removed as necessary.

Preferably, the holes 49, 51 are minimized in diameter while allowing external connector pins used to pass through the holes. This may provide an enhanced sealed environment inside the casing 32, thereby enabling the positive thermistor device 31 to offer improved resistance against the atmosphere.

To also enhance the sealed environment inside the casing 32, the base 33 and cover 34 are tightly coupled together. To do this, the base 33 has two hooks 52, whereas the cover 34 has corresponding recesses 54 rigidly engageable with hooks 52. With these members, base 33 and cover 34 may be readily engaged and combined with each other in a snap-like fashion to provide an integral air-tight casing structure. Furthermore, the base 33 has a rib 55 along its opening peripheral edge, while the cover 34 has a corresponding recess (not shown) for receiving the rib 55 on the opening peripheral edge thereof.

The position-alignment scheme as employed for the positive thermistor disk 35 inside the casing 32 is as follows.

Figure 7:
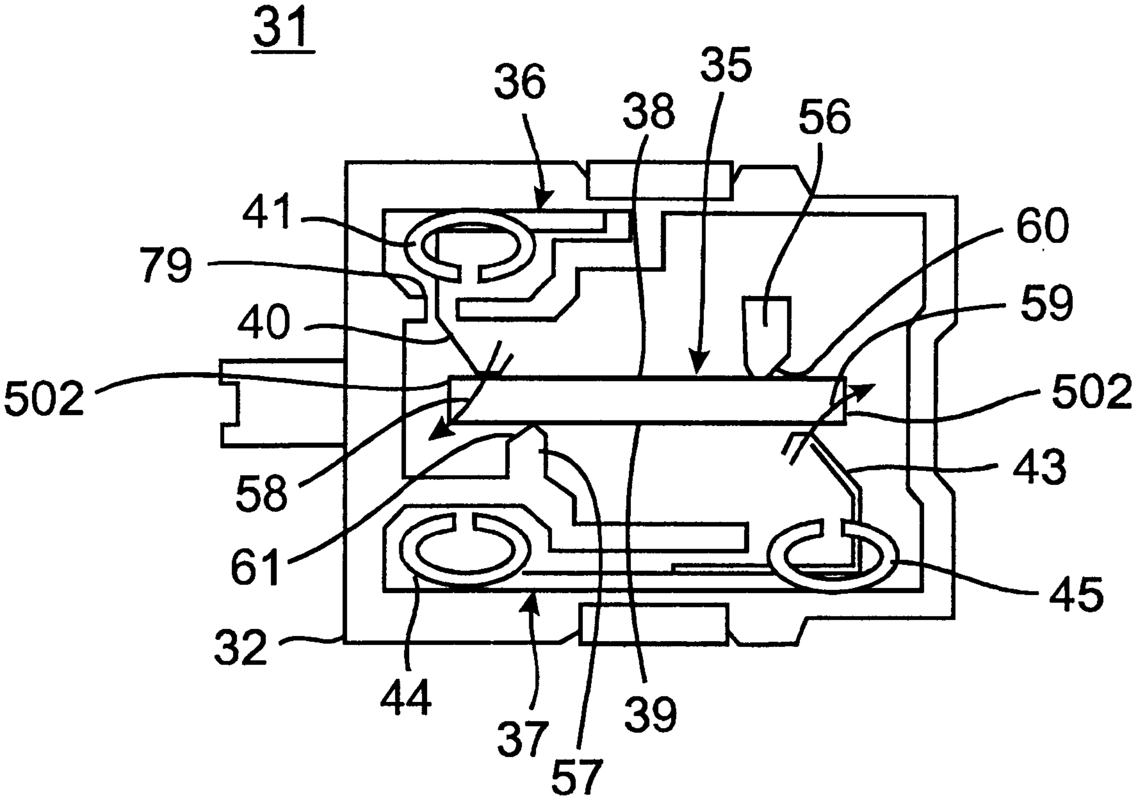
FIG. 7 is a plan view of the positive thermistor device showing its main parts inside the thermistor device of FIG. 1.

See FIG. 7, which depicts a plan view of the positive thermistor device 31 after assembly, with several parts or components being removed to reveal the internal structure thereof for purposes of illustration only. The casing base 33 is a walled enclosure having position determination projections 56, 57 standing upright from the bottom of the walled enclosure. These projections cooperate with the spring contact pieces 40, 43 to force the positive thermistor disk 35 to be elastically supported or suspended by the projections and contact pieces and also interposed therebetween, thus providing precise position alignment for attaining a substantially "floating" suspension of the thermistor disk 35 inside the casing 32 as separated from the inner walls thereof. In the illustrative embodiment, the casing 32 is designed as shown in FIG. 4 so that the floating thermistor disk 35 measures 1 millimeter (mm) or more in the distance 76 between it and the inner wall of casing 32, as indicated using a broken line in FIG. 4.

More specifically, as best illustrated in FIG. 7, a first pair of the spring contact piece 40 and one position-alignment projection 56 are arranged to come in contact with one principal plane of the positive thermistor disk 35, whereas a second pair of opposed spring contact piece 43 and position-alignment projection 57 are in contact with the opposite principal plane of disk 35, thereby elastically supporting disk 35 as interposed therebetween inside casing 32. Notably, the first spring contact piece 40 and the second spring contact piece 43 are specifically disposed so that they diagonally oppose each other, while the first position-alignment projection 56 and second position-alignment projection 57 cross-diagonally oppose each other, as can be seen from the illustration of FIG. 7. In other words, a line connecting the opposed spring contact pieces 40, 43 together crosses a line connecting projections 56, 57, to horizontally define an X-shaped line combination, in this situation, the spring contact pieces 40, 43 are elastically in contact with the opposite electrodes 38, 39 of thermistor disk 35 to provide electrical connection therebetween. The position-alignment projections 56, 57, which are formed integrally with base 33 are electrically insulative, so that these constitute insulative contacts with disk electrodes 38, 39.

It is also important that while the first spring contact piece 40 opposes the second position-alignment projection 57 with the thermistor disk 35 being interposed therebetween, contact 40 is at an outer position closer to the periphery of disk 35 than its corresponding projection 57. The same applies with respect to the other combination of the second spring contact piece 43 and the first position-alignment projection 56. Contact piece 43 is at a position closer to the opposite periphery of disk 35 than projection 56 as shown in FIG. 7. With this "outer offset positioning" feature of spring contacts 40, 43, the resulting application of spring force to disk 35 directs outward relative to the direction of thickness of disk 35, as designated by arrows 58 in FIG. 7.

It is a further important exemplary feature of this embodiment that the first and second position-alignment projections 56, 57 have slanted cut-away portions 60, 61 at their tip ends. More specifically, the sides of the projections 56, 57 closest to the peripheral portions of the disk 35 are slanted. These cut-away portions 60, 61 may advantageously serve to increase or maximize efficiency and/or workability of the spring force as applied from respective contact pieces 40, 43 toward the radially opposed peripheral edges of disk 35 along the outward directions as indicated by arrows 58 in FIG. 7.

After long use of the positive thermistor device 31, it may happen that its internal thermistor disk 35 experiences occurrence of cracks due to material fatigue thereof. In the worst case, the disk 35 can be destroyed physically. Even if this is the case, the spring contact pieces 40, 43 and the position-alignment projections 56, 57 for elastic support of the disk 35 may advantageously serve to suppress or eliminate occurrence of any continuous flow of abnormal current therein due to the presence of a short-circuit, resulting from electrical shorting of residual fragments after destruction. The operation of the contact pieces 40, 43 and the projections 56, 57 is as follows.

Figure 8A:
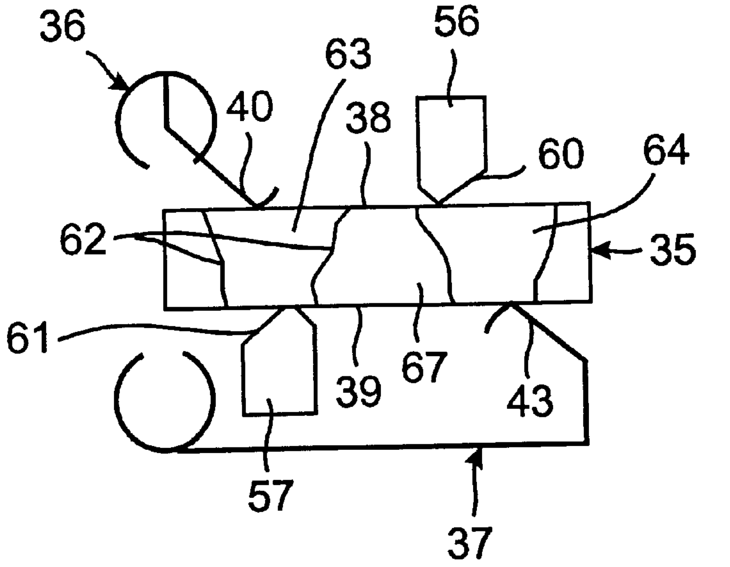
FIG. 8A and 8B show plan views at major steps of a process where the positive thermistor device of FIG. 7 experiences occurrence of cracks which result in destruction.
Figure 8B:
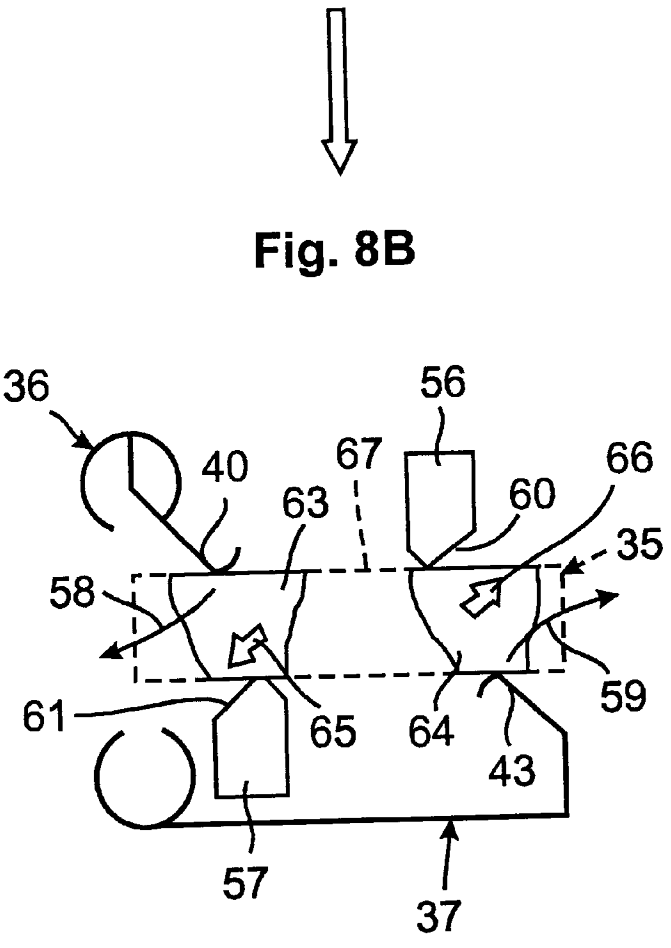

See FIG. 8A, which diagrammatically illustrates one exemplary occasion where cracks 62 take place in the positive thermistor disk 35 along the thickness thereof due to occurrence of sparks therein causing disk 35 to physically break into several portions or fragments. In this situation, the compressive forces continue to be applied toward disk 35 from the spring contact pieces 40, 43. Accordingly, certain fragments must be present which remain interposed between contact pieces 40, 43 and projections 56, 57 inside the casing 32. One specific fragment 63 is elastically supported by the first spring contact piece 40 and its opposite projection 57, and another fragment 64 is supported by the second contact 43 and projection 56 as shown in FIG. 8B. Note here that the remaining fragments of disk 35, including one fragment 67 indicated by the broken line in FIG. 8B, have broken away because of the fact that no such elastic support members secure them reside at their original positions.

Under the condition as demonstrated in FIG. 8B, the spring contact pieces 40, 43 connected with the opposite electrodes 38, 39 of the thermistor disk 35 are prevented from directly opposing each other via the disk 35, while inhibiting creation of any current flow path that extends from the first spring contact piece 40 through residual disk fragments 63, 64 to the second spring contact piece 43. This can ensure that any possible current flow or power supply is interrupted or cut off, ensuring that the internal circuitry of positive thermistor device 31 is in the open state, that is, rendered electrically nonconductive.

Hence, a significant exemplary advantage of the positive thermistor device 31 embodying the invention is that, even when power is being supplied to the internal thermistor disk 35 after destruction thereof, since the operator cannot be aware of the interior state of the device 31, it becomes possible to reliably eliminate the transition of the device 31 into a more dangerous malfunction stage. This stage may otherwise occur due to the presence of continuous flow of abnormal current that results from the fact that the residual fragments 63, 64 adversely act to produce an alloy together with spring contact pieces 40, 43 upon continuous application of power supply to provide an electrically shorted state, inducing such abnormal heat inside the sealed environment of the positive thermistor device 31.

Another significant advantage of the illustrative embodiment is that any residual fragments 63, 64 between contacts 40, 43 and projections 56, 57 can be forced to deviate or offset in position so that they disperse far apart from each other inside the device 31. It has been stated that the direction of action of spring forces induced by spring contact pieces 40, 43 are specifically arranged to direct outward relative to the thickness direction of the thermistor disk 35, as demonstrated by use of arrows 58, 59 in FIG. 8B, whereas projections 56, 57 have specific slanted cut-away portions 60, 61 at the outer periphery of their tip ends. The combination of such structural features serves to force the residual fragments 63, 64 elastically supported by contact pieces 40, 43 and projections 56, 57 to disperse far away from each other as indicated by fat arrows 65, 66 in FIG. 8B.

The foregoing "fragments outward separative movement" feature may advantageously act to further enhance the possibility of achievement of an electrical open state inside the thermistor device 31 after accidental destruction. Specifically, even when an "intermediate" fragment 67 of FIG. 8B that is free from any elastic support remains between two elastically supported fragments 63, 64, these fragments 63, 64 are forced to disperse far away from each other, preventing any possible electrical contacts from arising between the intermediate fragment 67 and its neighboring fragments 63, 64, so that an electrical short-circuit will no longer take place therebetween. Additionally, in most cases, the intermediate fragment 67 will break away due to the "separative movement" of its neighboring fragments 63, 64. Also, these fragments by themselves tend to break away due to positional deviation along the arrows 65, 66 inside the thermistor device 31.

Figure 9:
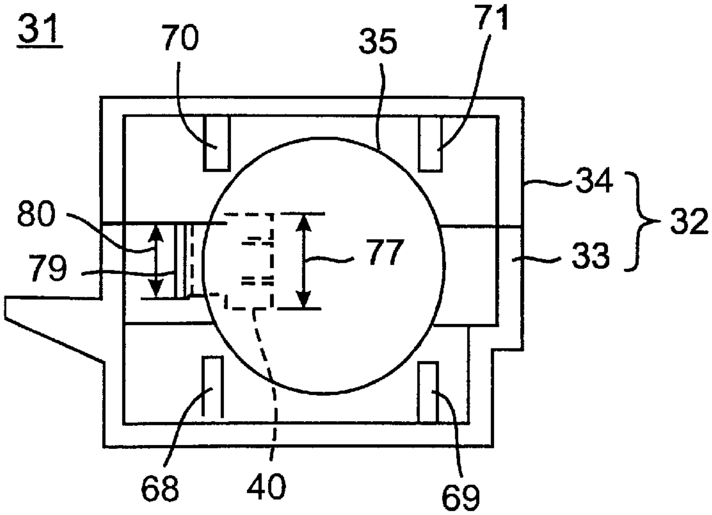
FIG. 9 is a front view of the positive thermistor device of FIG. 1 showing its main parts as arranged inside the device.

The description regarding the device 31 continues with reference to FIG. 9, which shows a side view of the interior of device 31, with several parts omitted from the device for purposes of illustration only. As shown, the casing base 33 is provided with upward extending position-control projections 68, 69 that extend from the bottom thereof, whereas the cover 34 has similar downward extending position control projections 70, 71 to oppose base projections 68, 69. These vertical projections 68–71 are provided to ensure that even when the internal thermistor disk 35 happens to positionally deviate due to vibrations in the direction of its principal planes, such deviation continues to fall within a predefined range. This may suppress or eliminate occurrence of the shortage of current-flow capacity at terminals which will otherwise occur due to positional deviations of spring contact pieces 40, 43 with respect to terminals 38, 39 of the thermistor device 31.

Figure 10:
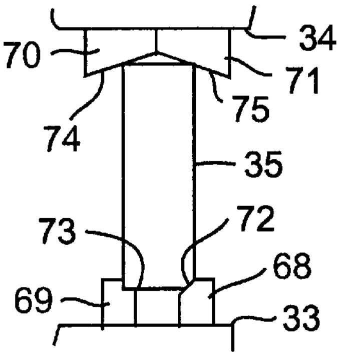
FIG. 10 is a diagrammatical representation for explanation of the relation between the positive thermistor device of FIG. 9 and its associated position-alignment projections.
Figure 11:
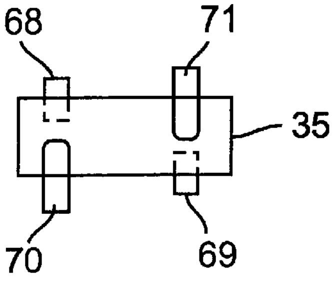
FIG. 11 is a diagrammatical representation for explanation of a planar positional relation of the positive thermistor versus position-alignment projections shown in FIG. 9.

The positional relation of such projections 68–71 can be better seen from FIGS. 10 and 11. FIG. 10 shows another side view of the interior of thermistor device 31 with an edge of disk 35 depicted as a front part; FIG. 11 depicts a plan view of the device. As shown in FIG. 10, the disk 35 is secured by upper (cover) and lower (base) projections 68–71 at the four corner edges thereof. As best shown in FIG. 11, looking at the device from the upper side, these projections 68–71 are cross-disposed inside casing 31 in such a manner that base projections 68, 69 diagonally oppose each other along one planar diagonal line, while cover projections 70, 71 cross-diagonally oppose each other along the another diagonal line.

It can be seen from viewing FIG. 10 that the projections 68–71 have slanted cut-away planes 72–75, respectively, to provide a pin-point contact arrangement for support of disk 35 at its four circumferential corner edges.

Figure 12:
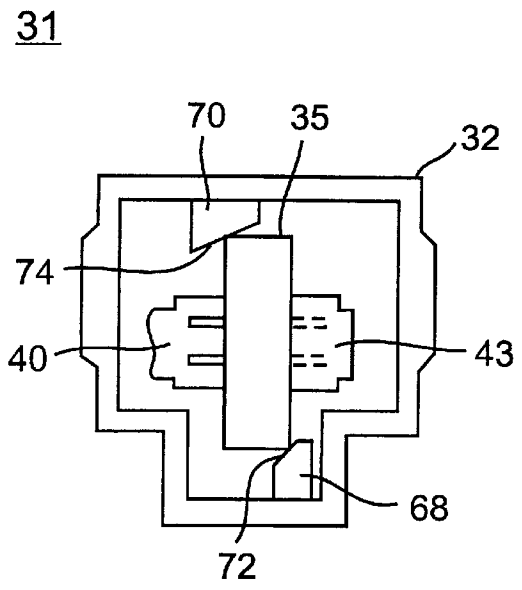
FIG. 12 is a side view of the embodiment for explanation of the contact state of the positive thermistor with the position-alignment projections of FIG. 9.
Figure 13:
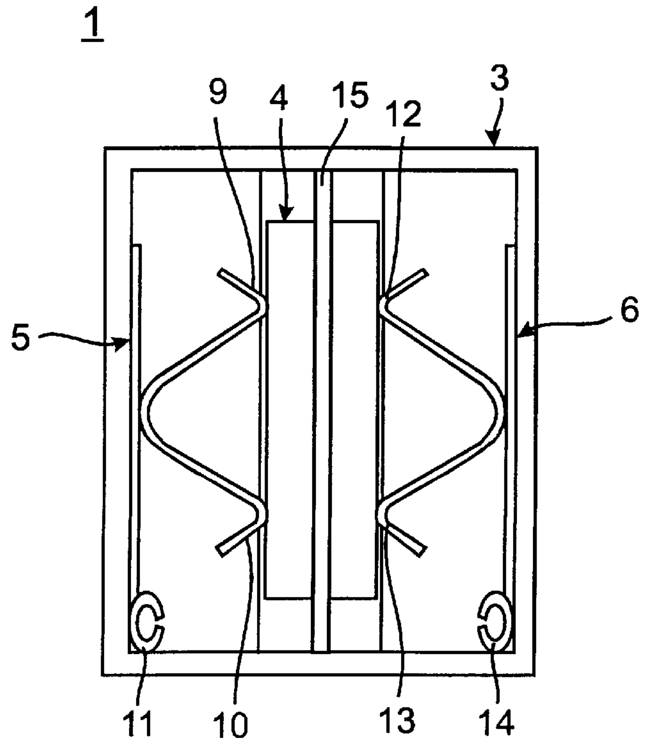
Fig. 13 (Prior Art)
FIG. 13 is a plan view of one prior art positive thermistor device, with a cover thereof being removed for purposes of illustration.
Figure 14:
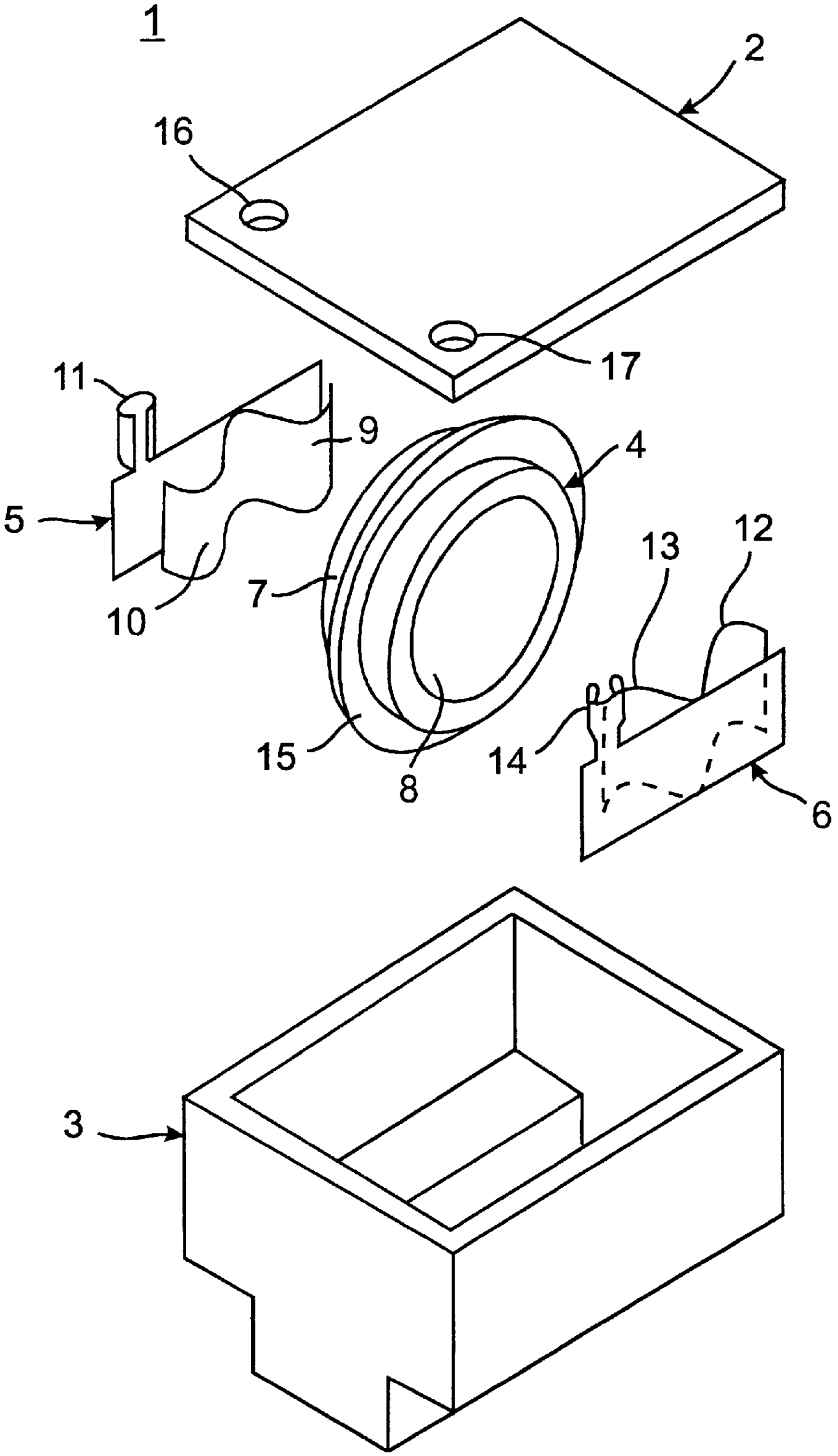
Fig. 14 (Prior Art)
FIG. 14 is a perspective view of the prior art device of FIG. 13, wherein parts or components thereof are illustrated in an exploded manner.
Figure 15A:
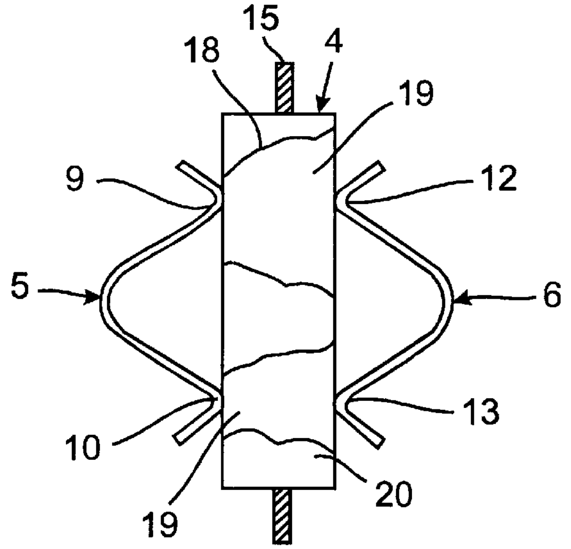
Fig. 15A (Prior Art)
FIGS. 15A and 15B show front views of the prior art device of FIG. 13 at major steps of a process where the prior art device experiences occurrence of cracks which result in destruction.
Figure 15B:
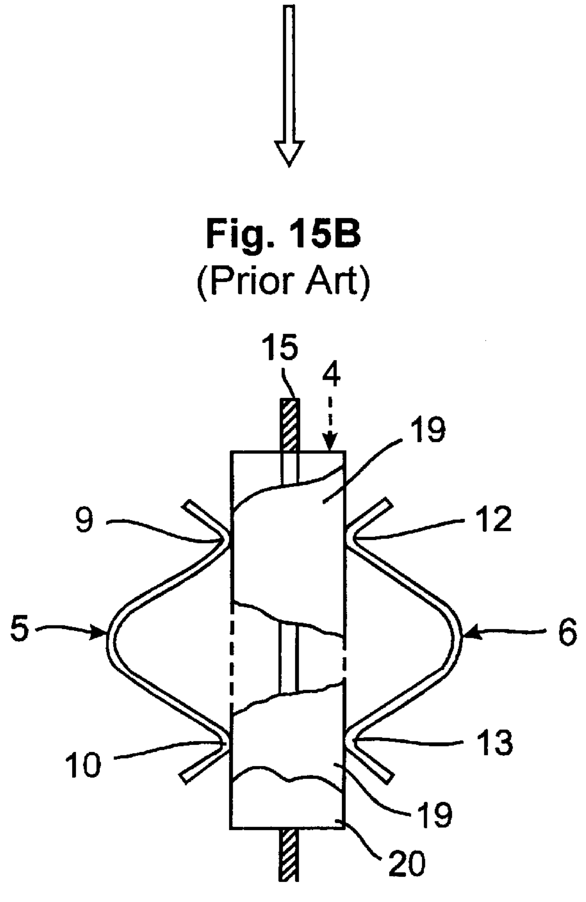
Fig. 15B (Prior Art)
Figure 16:
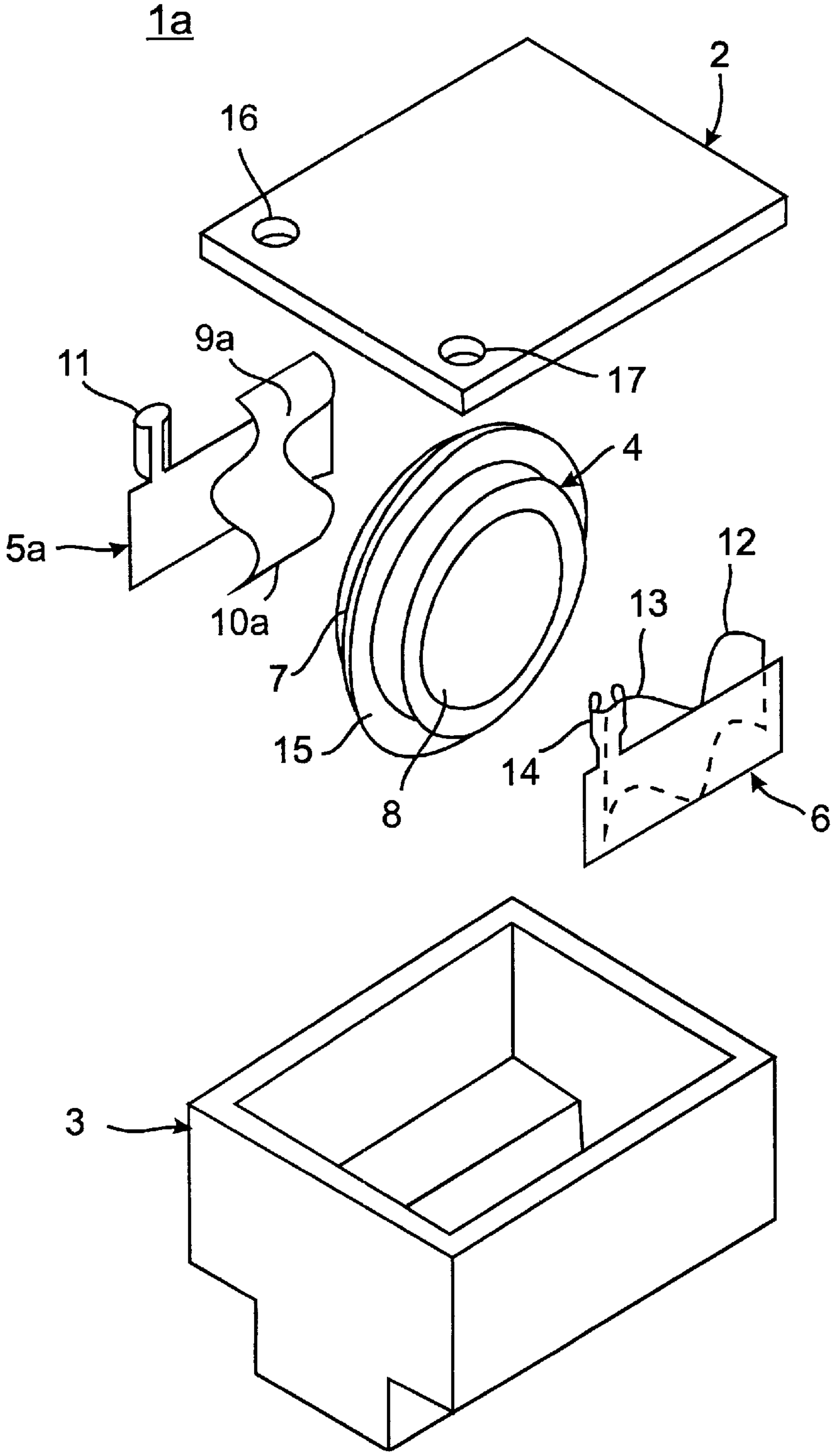
Fig. 16 (Prior Art)
FIG. 16 illustrates an exploded perspective view of another prior art positive thermistor device.
Figure 17:
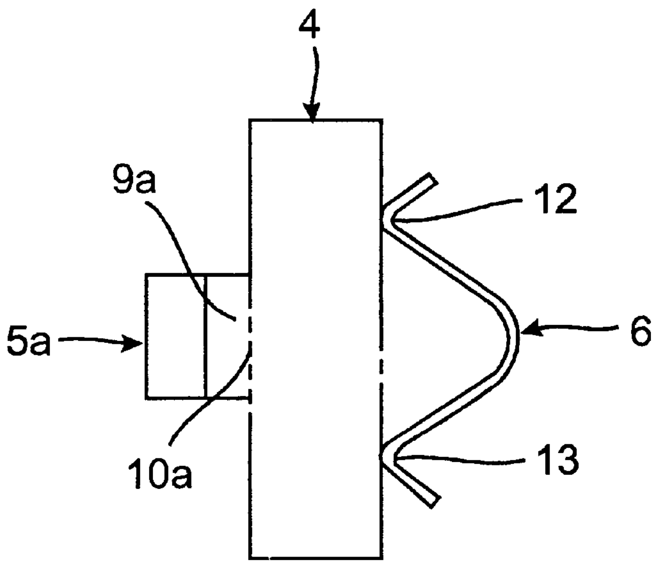
Fig. 17 (Prior Art)
FIG. 17 is a plan view of the major part of the prior art device shown in FIG. 16 for explanation of the positional relation of a positive thermistor element and its associated spring contact pieces.
Figure 18:
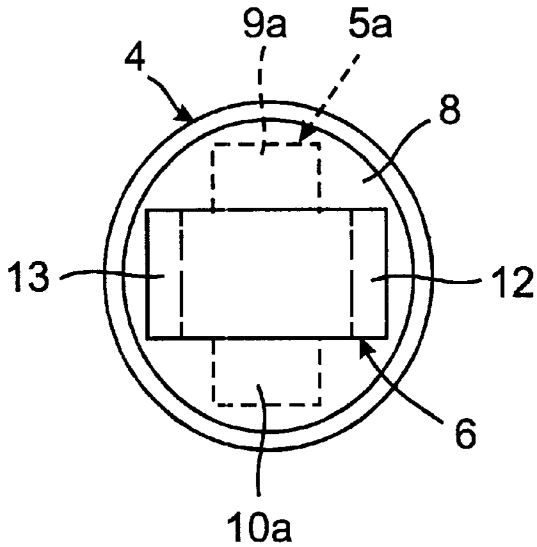
Fig. 18 (Prior Art)
FIG. 18 is a side view of the major part of the prior art device shown in FIG. 16 for explanation of the positional relation of a positive thermistor element and its associated spring contact pieces looking at the device from the electrode formation side of the positive thermistor element.
Figure 19:
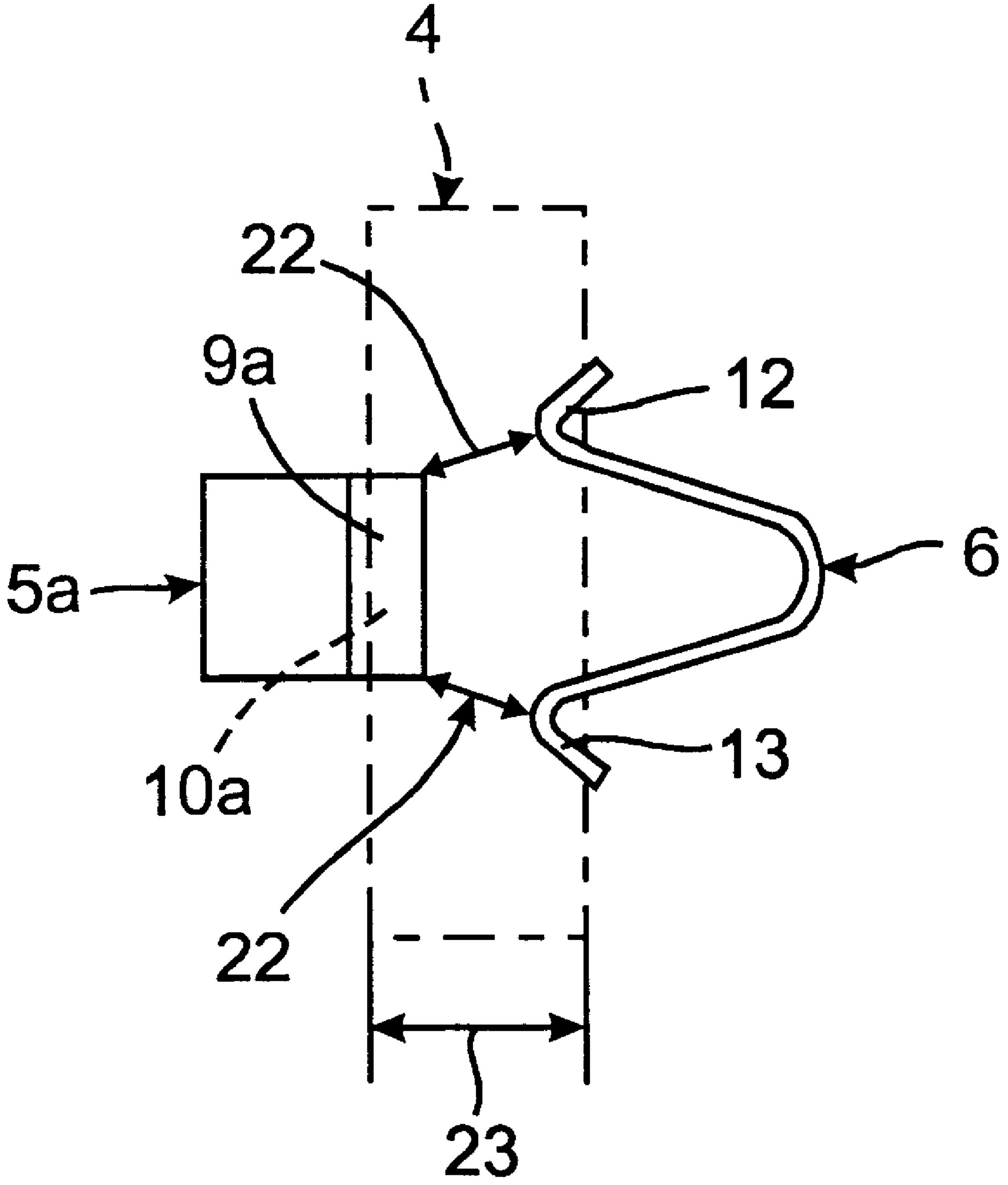
Fig. 19 (Prior Art)
FIG. 19 is a plan view of the major part of the prior art device of FIG. 16 for explanation of the dimensions and positioning of the spring contact pieces, with the thermistor element removed.
Figure 20A:
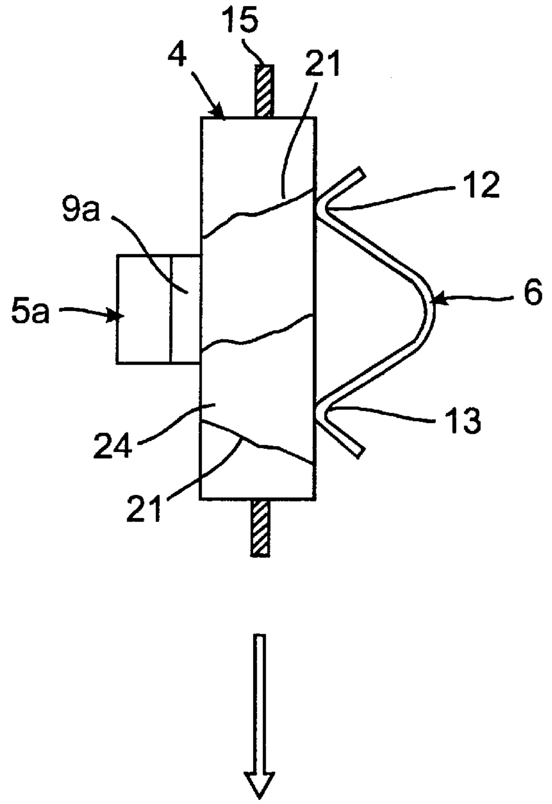
Fig. 20A (Prior Art)
FIGS. 20A and 20B show front views of the positive thermistor element in the prior art device shown in FIG. 16 at major steps of a process in which this element experiences occurrence of cracks which result in destruction.
Figure 20B:
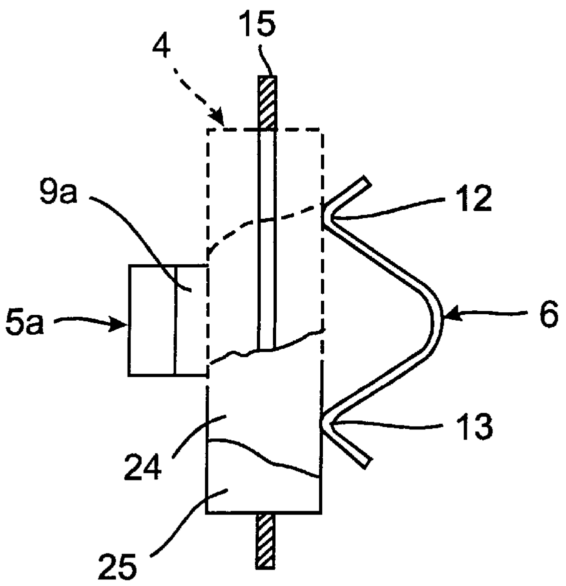
Fig. 20B (Prior Art)
Figure 21:
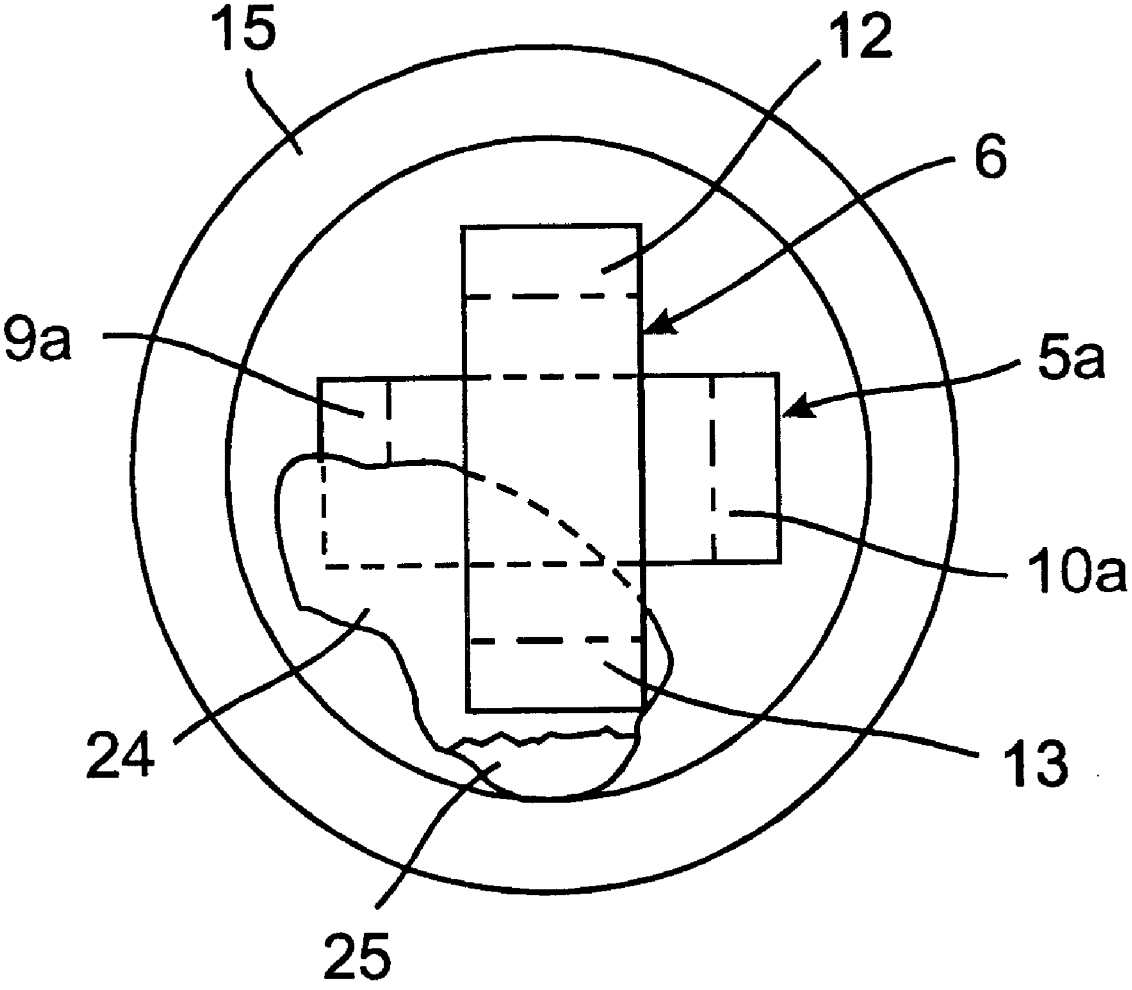
Fig. 21 (Prior Art)
FIG. 21 shows a destruction state of the prior art positive thermistor element having cracks as shown in FIG. 20A, when looking at the device from the right side of the structure of FIG. 20B.

A significant advantage as derived from the position-control projections 68–71 is that the thermistor device 31 can be greatly improved in safety. More specifically, the casing 31 may become partly carbonized at positions near the thermistor disk 35 due to occurrence of sparks as induced by accidental destruction thereof, resulting in a decrease or degradation in tracking performance, which in turn leads to formation of an undesirable conductive path that may permit continuous flow of abnormal current. As an example, position-control projections 68–71 can be carbonized due to sparks causing a conductive path to be defined therein. If this is the case, the thermistor disk 35 will deviate positionally in the direction of its principal planes. For instance, as shown in FIG. 12, the disk 35 happens to come in contact with the diagonally opposite projections 68, 70. Even under this condition, since each of these projections 68, 70 is prevented from extending in a direction in which disk 35 can be short-circuited along the thickness thereof, no conductive path will take place between the electrodes 38, 39 of disk 35, irrespective of whether projections 68, 70 are actually carbonized or not. This may promote enhancement in safety during extended operation of device 31.

Turning back to FIG. 6, the spring contact pieces 40, 43 are narrowed in width at most portions as compared with a contact tip portion for electrical contact with the electrodes 38, 39 of disk 35, as indicated by the numerals 77, 78 with respect to one contact piece 40 shown. The explanation continues as to one spring contact piece 40, but the same discussion applies to the other piece as well. Such width difference may shorten (see FIG. 9 again) the vertical size 80 of a slit 79 that is defined at a wall 48 (see FIG. 6) in base 33 for penetration of spring contact piece 40 therethrough. This may advantageously serve to suppress generation of air flow between a space for holding therein the socket 41 coupled to opening 49 and a space for supporting disk 35, thus enhancing the atmosphere-restricting characteristics of the device 31. Yet on the other hand, it is possible to retain sufficient capacity for current flow at such contact sections for the reason that a relatively greater width 77 can be maintained for the exact contact tip end of contact piece 40 with electrode 38.

In this embodiment, as can be seen from FIGS. 1, 3 and 4, a rib 81 is arranged on the outer surface of the casing base 33 so as to partition the base bottom into two areas: one for projection of the fastener edges 42, 46, and the other for projection of fastener edge 47. This rib 81 acts to lengthen the creepage distance between fastener edges 42, 46 and edge 47, thus enhancing the tracking resistant performance and external voltage withstanding characteristic therebetween, which may in turn lead to improvements in reliability and safety of the thermistor device 31. The presence of such rib 81 may also be effective to decrease the surface temperature of casing 32 in the vicinity of fastener edges 42, 46, 47. The rib 81 can further contribute to suppression of bowing which may occur during molding of casing base 33, thus improving the accuracy of engagement of the base 33 with the cover 34 so that its resistance to the atmosphere can be improved accordingly.

Figure 22:
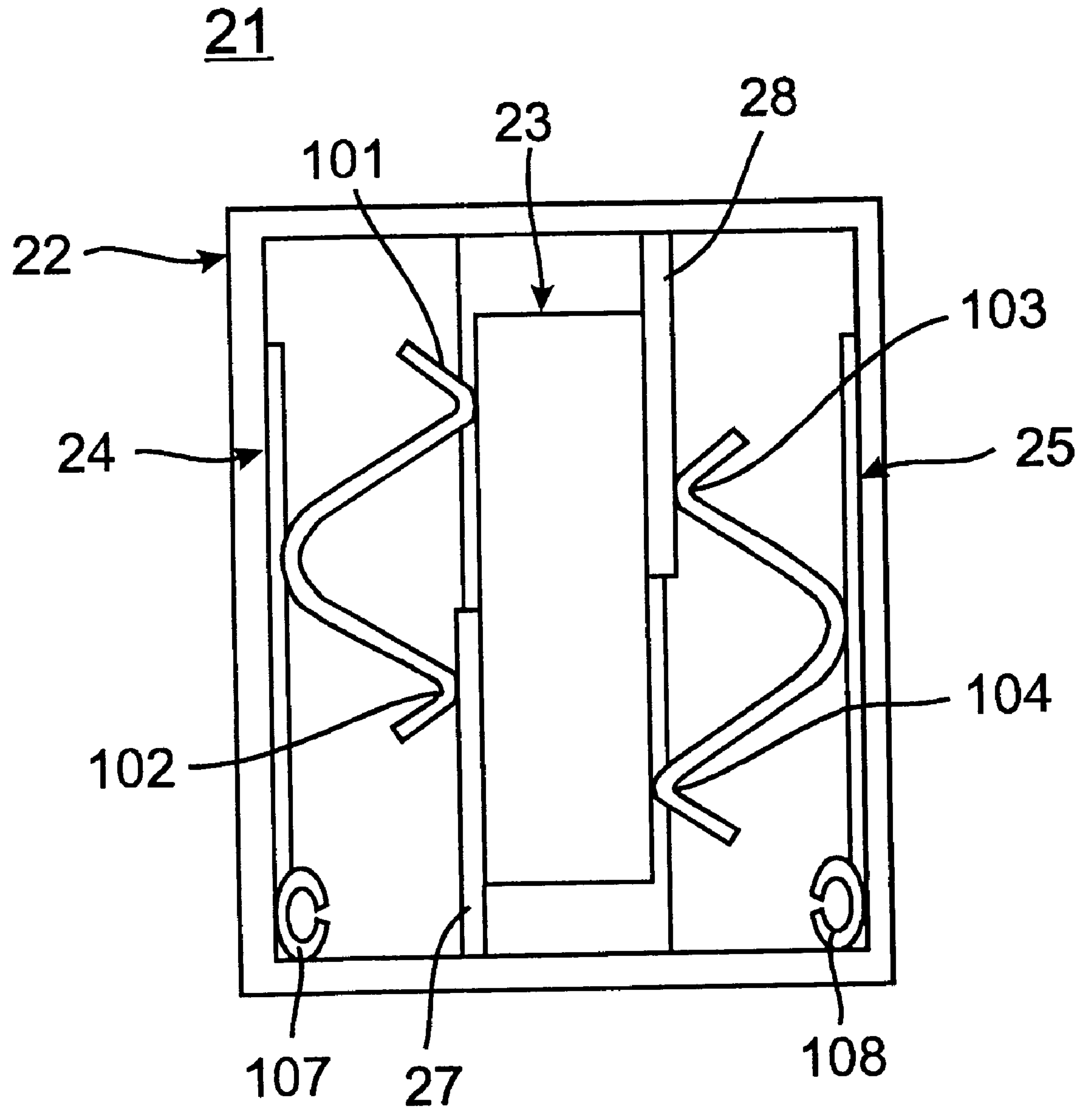
FIG. 22 is a plan view of an electronic module in accordance with another preferred embodiment of the invention, with a cover thereof being removed for purposes of illustration only.
Figure 23:
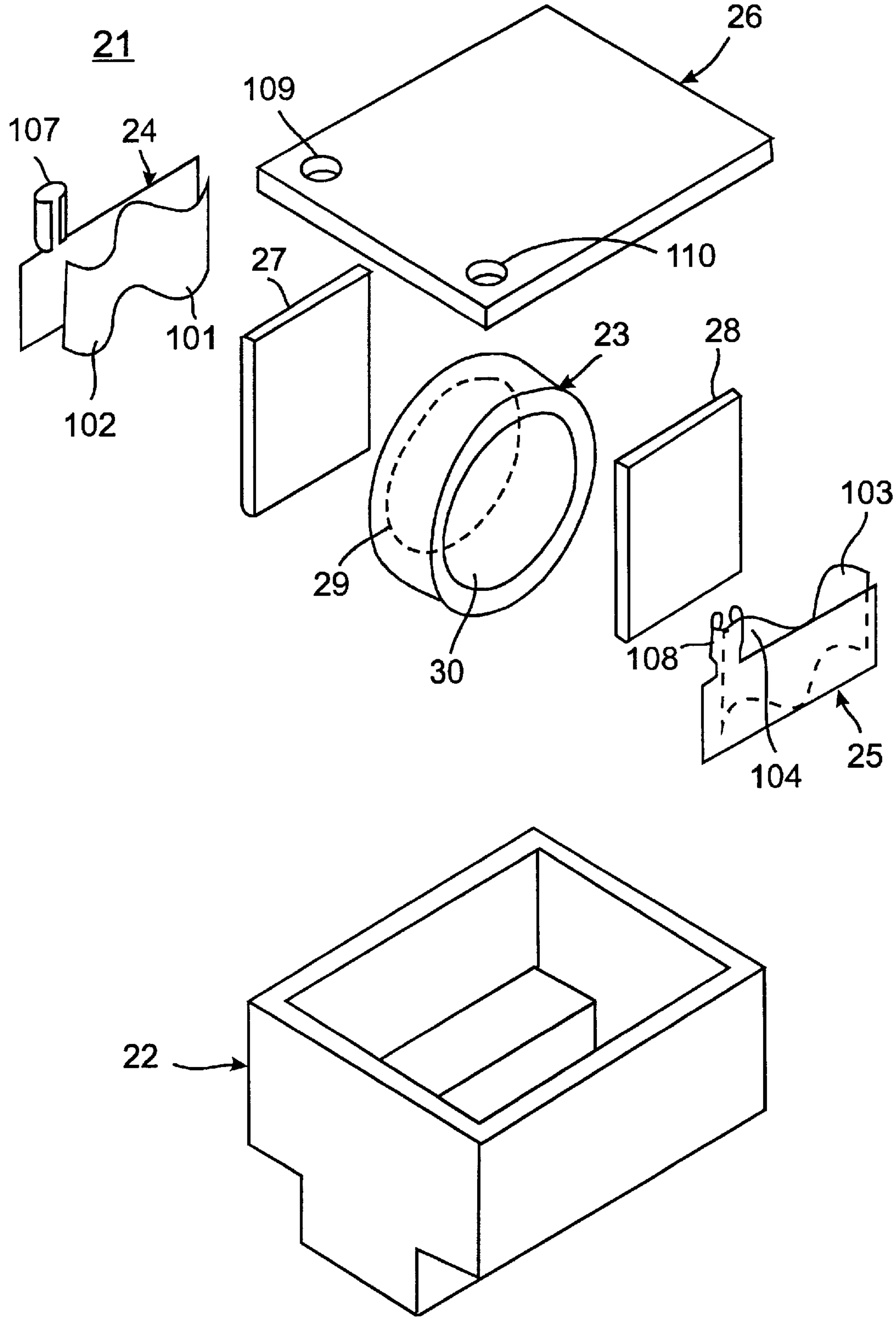
FIG. 23 is an exploded perspective view of the electronic device shown in FIG. 22.

A positive thermistor device in accordance with another embodiment of the invention is generally designated by the numeral 21 in FIGS. 22 and 23. This device 21 is generally similar in structure to the thermistor device 31. It includes a casing base 22, a positive thermistor element 23, terminal members 24, 25, and a cover 26 for closure of an upper opening of base 22. In addition to such parts, the device 21 has therein electrically insulative square plate members 27, 28 as best shown in FIG. 23.

The base 22 is made of a chosen heat-resistant incombustible material that offers incombustibility equivalent to the level "94V-0" of the UL standards, such as phenol, polyphenylenesulfite, polybutylene terephthalate, or the like. The base 22 may alternatively be made of inorganic resin. The base 22 is structured to have a projection on part of the bottom thereof allowing the positive thermistor element 23 to be stably held therein while enabling suitable position-determination of terminals 24, 25 and insulative plates 27, 28 therein.

The thermistor element 23 is formed into a disk-like shape, with electrodes 29, 30 disposed on the opposite sides thereof. The element 23 may alternatively be formed in another shape, such as a rectangular plate. Each electrode 29, 30 may be a lamination of an underlying Ni layer and an overlying silver Ag layer. Preferably, the underlying layer is exposed at the periphery of its overlying layer for elimination of migration of Ag material. The two-terminal positive thermistor disk 35 is centrally inserted into the inside of base 22 with its electrodes 29, 30 laterally disposed from each other.

One terminal member 24 has a pair of spring contact pieces 101, 102 defining a W-shaped wing, and a socket 107 receiving therein an external connector pin (not shown) to provide electrical connection therebetween. A plate constituting the spring contact pieces 101, 102 and a plate forming socket 107 are combined together by spot welding techniques. These pieces 101, 102 may be modified into any other shapes as necessary. Modifying the shape of pieces 101, 102 may also lead to the possibility of integral formation of pieces 101, 102 and socket 107.

Similarly, the other terminal member 25 has two spring contact pieces 103, 104 and a socket 108. The first and second terminal members 24, 25 are made of a chosen metallic material such as stainless steel, copper alloy and the like, thereby providing the members with appropriate elasticity and electrical conductivity. These terminals 24, 25 are packed into base 22 while causing thermistor disk 23 to be elastically disposed between the terminals in the base 22.

As shown in FIG. 22, the spring contact pieces 101, 102 of the first terminal 24 are positionally shifted from the center toward one side (upward in the illustration of FIG. 22) of its corresponding thermistor electrode 29, while causing its elastic or compressive force to be applied thereto. The spring contact pieces 103, 104 of the second terminal 25 are reversely shifted in position from the center toward the opposite side (downward in FIG. 22) of its associative electrode 30, while letting its compressive force act thereonto. This enables thermistor disk 23 to be substantially in a "floating" condition inside base 22 due to the elastic support applied to both its sides as attained by cooperation of sequential contact pieces 101, 103, 102, 104.

The rectangular insulative plates 27, 28 are disposed inside the base 22 such that the first plate 27 is interposed between one piece 102 of the first terminal 24 and the first electrode 29, while the other plate 28 is between one piece 103 of the second terminal 25 and the second electrode 30, as can be readily seen from FIG. 22.

Note that these insulative plates 27, 28 may be replaced with insulative films covering selected surface area portions of electrodes 29, 30, whereat corresponding contact pieces form contacts with the films, or alternatively, replaced by electrically insulative films or chips made of inorganic or resin material as deposited to partly cover the outer surface of pieces 102, 103.

After assembly of thermistor disk 23, terminals 24, 25 and insulative plates 27, 28 into base 22, the cover 26 is attached to close the upper opening of base 22 to provide a substantially sealed environment therein. For rigid attachment of base 22 and cover 26, an appropriate engagement structure is employed. Cover 26 may be made of the same material as base 22. This cover 26 has holes 109, 110 through which external connector pins (not shown) can pass to be inserted into corresponding sockets 107, 108.

In the positive thermistor device 21, the terminals 24, 25 and insulative plates 27, 28 constitute an elastic support mechanism for thermistor element 23, which includes supporting contacts for one thermistor electrode 29 as attained by the spring contact piece 101 and insulative plate 27, and supporting contacts for the opposite electrode 30 achieved by insulative plate 28 and spring contact piece 104. These elements are specifically disposed at different positions on the opposite electrodes 29, 30 in such a manner that insulative plates 27, 28 diagonally oppose each other via the disk 23 interposed therebetween as shown in FIG. 22, while the first spring contact pieces 101, 102 and the second spring contact pieces 103, 104 are positionally shifted toward the opposite side edge portions of disk 23, preventing each piece 101, 102 on the first electrode 29 from directly opposing a corresponding one of pieces 103, 104 on the second electrode 30 along the thickness of disk 23.

More specifically, the touching position of the spring contact piece 101 on the first electrode 29, which constitutes a first contact section, is shifted or positionally offset toward one outer peripheral edge of thermistor disk 23 from the touching position of its corresponding spring contact piece 103 on the second electrode 30 via one insulative plate 28 sandwiched therebetween, the piece 103 constituting a third contact section. Likewise, the touching position of the spring contact piece 104 on second electrode 30, which constitutes a fourth contact section, is shifted to approach the other outer peripheral edge of disk 23 from the touching position of its corresponding spring contact piece 102 on first electrode 30 via the other insulative plate 27 sandwiched therebetween, the contact piece 102 constituting a second contact section. This alternate contact-position differentiation scheme provides an "unsymmetrical" contact positioning arrangement on the opposite electrodes 29, 30 of thermistor disk 23.

The spring contact pieces 101, 104 constituting the first and fourth contact sections are in electrical contact with the opposite thermistor electrodes 29, 30 to provide a conductive path for power supply to thermistor disk 23. On the other hand, the insulative plates 27, 28 constituting the second and third contact sections are in contact (mechanically and electrically insulatively) with electrodes 29, 30, while permitting no current flow therebetween.

In the positive thermistor device 21, the thermistor disk 23 may be destroyed due to occurrence of cracks therein as induced by sparks during extended operation. Even if this is the case, further flow of abnormal current can be successfully inhibited providing enhanced safety, as will be described in detail below.

Figure 24:
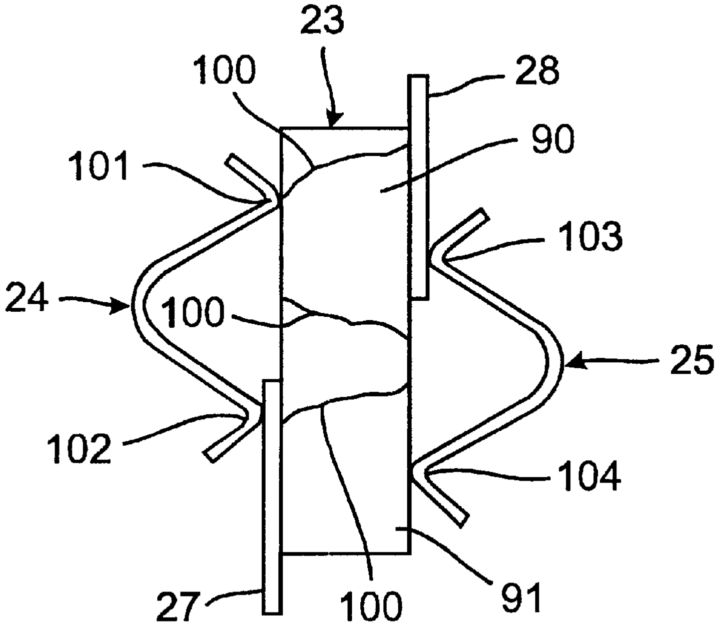
FIG. 24 is a plan view of a positive thermistor element provided in the electronic module of FIG. 22 for visual indication of cracks due to occurrence of sparks therein.

See FIG. 24, which diagrammatically represents an exemplary cracked state of the thermistor disk 23, which leads to physical destruction when disk 23 breaks into several fragments due to cracks 100. In this example, two fragments remain at their original positions. One fragment 90 is elastically supported by a pair of spring contact piece 101 and insulative plate 28, and the other fragment 91 is elastically supported by another pair of spring contact piece 104 and plate 27. The remaining fragments are dislodged from disk 23. As a result, as shown in Fig,. 25, these residual fragments 90, 91 are acted upon by the contact piece-plate pairs 101, 28 and 104, 27 to deviate the position of the principal planes from each other.

Under this condition, the spring contact pieces 101, 104 in electrical contact with the electrodes 29, 30 through neither of the insulative plates 27, 28, are prevented from directly opposing each other. In addition, these plates 27, 28 provide electrical insulation to any possible current flow paths, one of which paths extends from spring contact piece 101 through residual fragment 90 to opposite contact piece 103, and the other of which paths extends from contact piece 104 via residual fragment 91 toward its opposite contact piece 102. Accordingly, tile power Supply will be reliably interrupted or cut off with respect to disk 23 immediately after cracking destruction thereof. Moreover, the residual fragments 90, 91 can no longer remain in contact with each other due to forced positional deviation of the principal planes, thus rendering, the resultant internal circuitry electrically nonconductive (in the open state). This may prevent device 21 from degrading into any undesirable, more dangerous malfunction mode in which the residual fragments 90, 91 of thermistor disk 23 and the terminals 24, 25 induce alloying phenomena, causing electrical short-circuiting, to appear in disk 23, so that generation of abnormal heat further continues even after destruction thereof.

Figure 26:
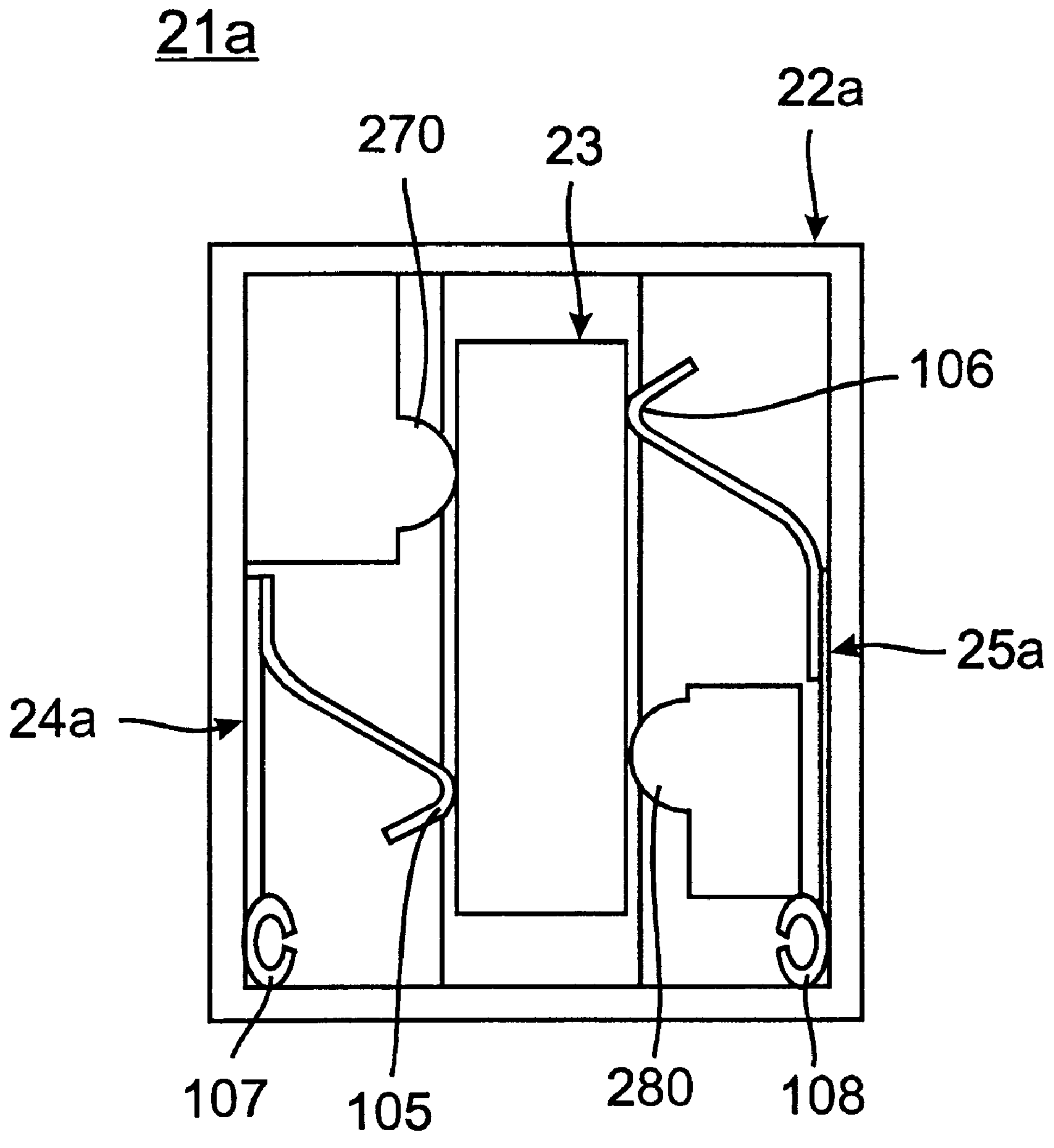
FIG. 26 is a plan view of an electronic module in accordance with still another embodiment of the invention, with its cover being removed for purposes of illustration only.
Figure 27:
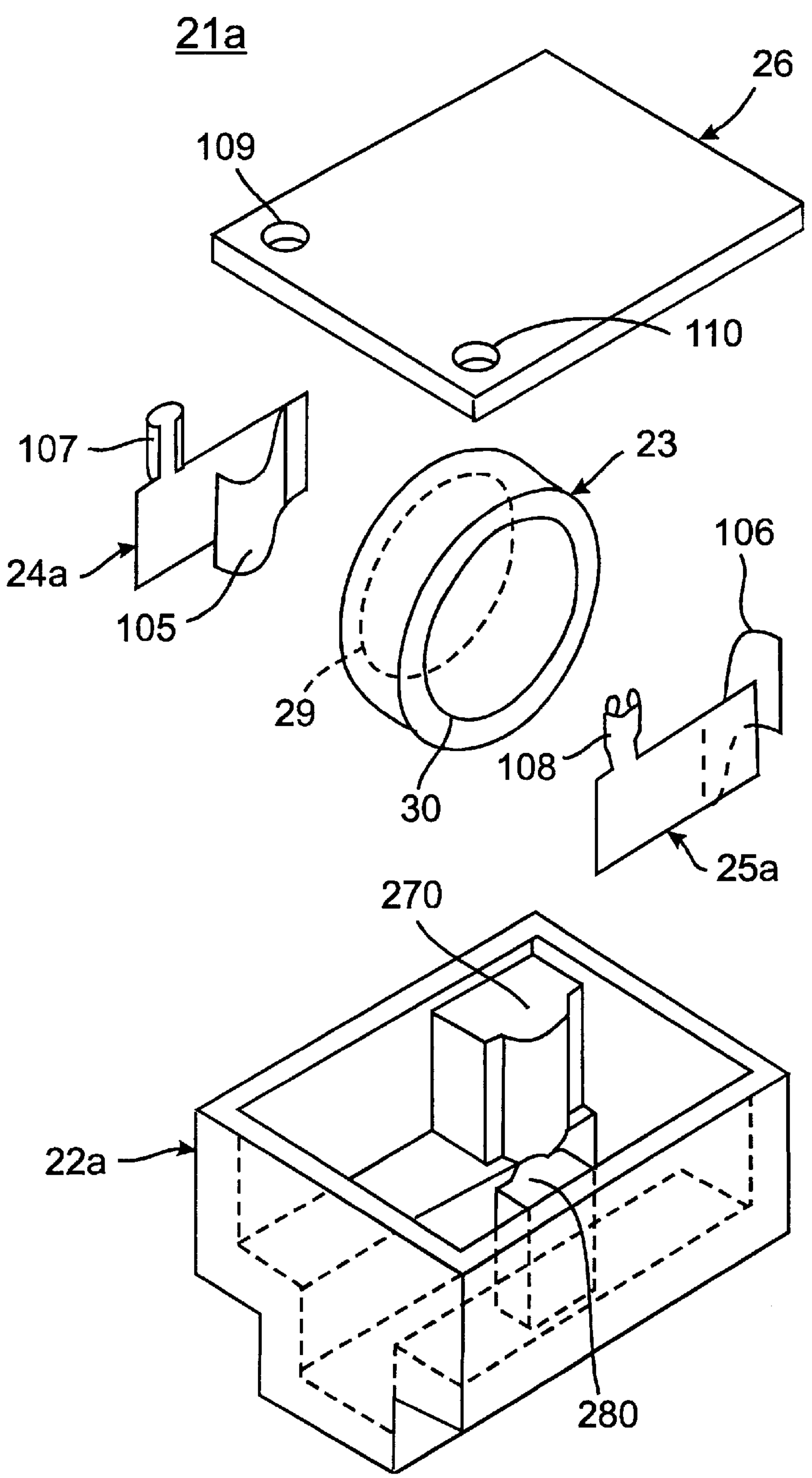
FIG. 27 is an exploded perspective view of the electronic module shown in FIG. 26.

A positive thermistor device in accordance with a further embodiment of the invention is shown in FIGS. 26 and 27, wherein the device is generally designated by numeral 21*a*. This device 21*a* is similar to that shown in FIGS. 22–23 with the exception that (1) the opposite terminal members 24, 25 are replaced with elements 24*a*, 25*a* of different structure, (2) the insulative plates 27, 28 of FIGS. 22–23 are removed, and (3) the casing base 22 is replaced by a base 22*a* having, insulative mold sections 270, 280 for attaining insulative support of thermistor disk 23 similar to that provided by plates 27, 28.

More specifically, as shown in FIG. 27, the first terminal member 24*a* has a single spring contact piece 105, while the second terminal 25*a* also has a single spring contact piece 106. These pieces 105, 106 are specifically disposed inside base 22*a* so that they diagonally oppose each other via disk 23, as best shown in FIG. 26. The insulative mold sections 270, 280 of base 22*a* are formed to define round protuberances at their tip ends respectively and are disposed to cross-diagonally oppose each other as shown in FIG. 26 with respect to pieces 105, 106 as shown. These members 105, 106, 270, 280 may constitute elastic support means for allowing disk 23 to be held between one pair of piece 105 and mold protuberance 270 and the other pair of piece 106 and protuberance 280. The mold protuberances 270, 280 may be formed integrally with base 22*a*, or alternatively be made of separate parts being attached or fixed to base 22a. It can be readily seen from viewing FIG. 26 that the spring contact piece 106, protuberances 270, 280 and contact piece 105 are alternately located on the opposite surfaces of disk 23.

With such an arrangement, similar functions and advantages to those previously identified may be achieved, as will be described in detail below.

In the positive thermistor device 21*a*, the elastic support mechanism for elastically supporting thermistor element 23 is constituted from terminal members 24*a*, 25*a* and base 22*a* having round insulative protuberances 270, 280. This support mechanism includes four, first to fourth contact sections for the first and second thermistor electrodes 29, 30, which sections are the spring contact piece 105, protuberances 270, 280 and contact piece 106, wherein contact piece 105 and protuberance 270 are on electrode 29, whereas contact piece 106 and protuberance 280 are on electrode 30. These support elements 105, 106, 270, 280 are located at different positions on the opposite electrodes 29, 30 in such a manner that any one of these elements is prevented from directly facing a corresponding one of the other elements. That is, the touching point of contact piece 105 on the first electrode 29 is positionally offset toward one peripheral edge of disk 23 from that of protuberance 280 on the second electrode 30, as can be seen from FIG. 26, whereas the touching point of contact piece 106 on the second electrode 30 is positionally offset toward the other, radially opposed peripheral edge of disk 23 from that of protuberance 270 on the first electrode 29, as shown.

The spring contact pieces 105, 106 constituting the first and fourth contact sections are electrically in contact with the first and second electrodes 29, 30 respectively, providing a conductive path for the power supply to disk 23. On the other hand, the first and second protuberances 270, 280 constituting the second and third contact sections are insulatively in contact with electrodes 29, 30.

Figure 25:
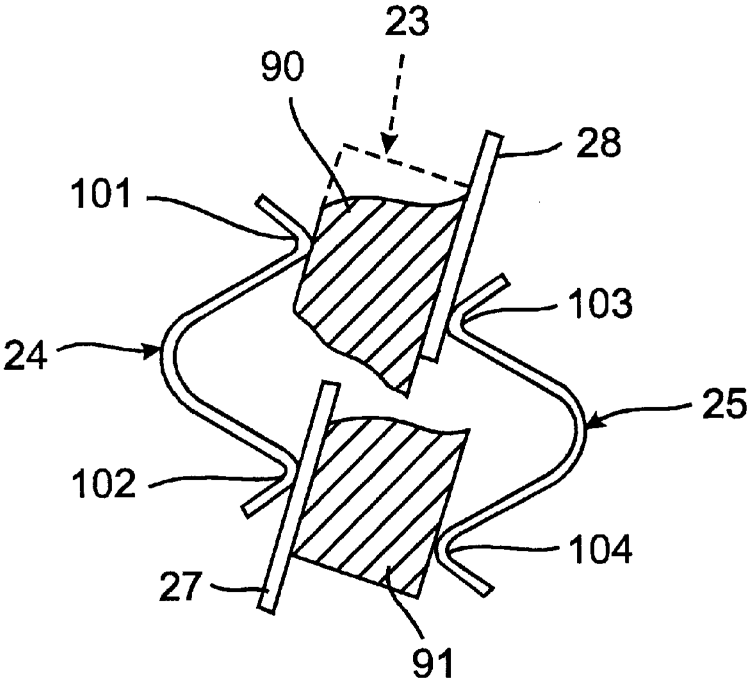
FIG. 25 is a plan view of the positive thermistor element thus destructed when cracks occurred.

In the positive thermistor device 21*a*, when the thermistor element 23 is accidentally cracked due to occurrence of sparks, certain fragments which are directly supported, by one pair of spring contact piece 105 and insulative protuberance 280 and also by the other pair of contact piece 106 and protuberance 270, may remain at their original positions due to application of compressive forces from the support pairs, while the remaining fragments fall away. Such residual fragments (these may correspond to fragments 90, 91 of FIG. 24) are given actuating forces causing their principal planes to deviate in position with respect to each other in a similar manner to that shown in FIG. 25.

In the foregoing situation, the spring contact pieces 105, 106 making electrical contacts with thermistor electrodes 29, 30 are prevented from directly opposing or facing each other via the thermistor disk 23 being interposed therebetween. The contact piece 105 merely opposes insulative protuberance 280, whereas contact 107 opposes protuberance 270. This causes any power supply to be interrupted, rendering the resulting circuitry nonconductive. It is thus possible, as in the previous embodiment device 21, to successfully eliminate electrical shorting conditions immediately after occurrence of abnormality during operation, enabling device 21*a* to be protected against a transition to a more dangerous malfunction mode due to further continuation of flow of abnormal current therein, even after destruction of thermistor disk 23 inside the casing stricture of the thermistor device 21*a*.

As seen in FIG. 26, the device 21*a* includes an electronic element, e.g., thermistor disk 23, having first and second electrodes on opposing sides relative to each other. A support elastically brackets the electronic element 23, the support having first and second contact portions, i.e., contact piece 105 and protuberance 270, respectively, in contact with different positions on the first electrode, respectively, and third and fourth contact portions, i.e., contact piece 106 and protuberance 280, respectively, in contact with different positions on the second electrode, respectively. The first and fourth contact portions, i.e., contact pieces 105 and 106, are electrically connected to the first and second electrodes, respectively, to form a conductive path to the electronic element. The second and third contact portions, i.e., protuberances 270 and 280, are in contact with the first and second electrodes in the electrically insulated state, respectively. Thus, as seen in FIG. 26, the electronic element 23 is supported by the first to fourth contact portions 105, 270, 280 106, respectively, in such a manner that the first and third contact portions exert forces on the electronic element in a direction toward each other and the second and fourth contact portions exert forces on the electronic element in a direction toward each other. Likewise, it will be seen from FIG. 26 that a straight line between points at which the first contact portion 105 and the fourth contact portion 106 contact the electronic element 23 intersects another straight line between points at which the second contact portion 270 and the third contact portion 280 contact the electronic element. As seen in FIG. 26, the electronic element 23 may be suspended at only four separate points defined by locations at which the first, second, third and fourth contact portions 105, 270, 280, 106, respectively, contact the electronic element.

As seen in FIG. 26, a first distance between the first and fourth contact portions 105 and 106, respectively, is longer than a second distance between the second and third contact portions, 270 and 280, respectively. A third distance between the first contact portion 105 and the third contact portion 280 is shorter than the second distance between the second contact portion 270 and the third contact portion 280, and a fourth distance between the second contact portion 270 and the fourth contact portion 106 is shorter than the first distance between the first contact portion 105 and the fourth contact portion 106.

While the invention has been particularly shown and described with reference to preferred embodiments thereof, it will be understood by those skilled in the art that various changes in form and details may be made without departing from the spirit and scope of the invention, as defined by the claims which follow.

For example, while the positive thermistor device 31 shown in FIGS. 1–12 includes the casing 32, this casing may be excluded if an alternative structure is employed therefor which can support the spring contact pieces 40, 43 and position-alignment projections 56, 57 while allowing the thermistor disk 35 to be elastically supported and interposed therebetween. The same applies with respect to the embodiment devices 21, 21*a* shown in FIGS. 22–27.

Also, the "fragment outward separative movement" feature of the invention does not always consist of both (1) the "spring force outward application" arrangement of pieces 40, 43 as denoted by the arrows 58, 59 of FIG. 8B and (2) the "fragments outer movement acceleration" arrangement of the projections 56, 57 as attained by formation of the cut-away portions 60, 61 at tip ends thereof. When appropriate, either one of these arrangements may be employed as needed.

In addition, the principles of the invention are not restricted to the illustrated thermistor device 31 including thermistor disk 35. The principles extend to any type of electronic device where it is desirable to prevent a short circuit upon the occurrence of a malfunction.

What is claimed is:

1. An electronic component comprising:

an electronic element having first and second electrodes on opposing sides relative to each other, and a support elastically bracketing the electronic element having first and second contact portions in contact with different positions on the first electrode, respectively, and third and fourth contact portions in contact with different positions on the second electrode, respectively, the first and fourth contact portions being electrically connected to the first and second electrodes, respectively, to form a conductive path to the electronic element, the second and third contact portions being in contact with the first and second electrodes in the electrically insulated state, respectively, the electronic element being supported by the first to fourth contact portions in such a manner that the first and third contact portions exert forces on the electronic element in a direction toward each other and the second and fourth contact portions exert forces on the electronic element in a direction toward each other.

2. The electric component according to claim 1, wherein a straight line between points at which the first contact portion and the fourth contact portion contact the electronic element intersects another straight line between points at which the second contact portion and the third contact portion contact the electronic element.

3. The electric component according to claim 1, wherein the electronic element is suspended at only four separate points defined by locations at which the first, second, third and fourth contact portions contact the electronic element.

4. An electronic component comprising:

an electronic element having first and second electrodes formed on opposite sides relative to each other, and a support elastically bracketing the electronic element having first and second contact portions in contact with different positions on the first electrode, respectively, and third and fourth contact portions in contact with different positions on the second electrode, respectively, a first distance between the first and fourth contact portions being longer than a second distance between the second and third contact portions, the first and fourth contact portions being electrically connected to the first and second electrodes, respectively, to form a conductive path to the electronic element, the second and third contact portions being in contact with the first and second electrodes in the electrically insulated state, respectively; and a third distance between the first contact portion and the third contact portion being shorter than the second distance between the second contact portion and the third contact portion, and a fourth distance between the second contact portion and the fourth contact portion being shorter than the first distance between the first contact portion and the fourth contact portion.

5. An electronic component comprising:

an electronic element having first and second electrodes formed on opposite sides relative to each other, and a support elastically bracketing the electronic element having first and second contact portions in contact with different positions on the first electrode, respectively, and third and fourth contact portions in contact with different positions on the second electrode, respectively, a first distance between the first and fourth contact portions being longer than a second distance between the second and third contact portions, the first and fourth contact portions being electrically connected to the first and second electrodes, respectively, to form a conductive path to the electronic element, the second and third contact portions being in contact with the first and second electrodes in the electrically insulated state, respectively; and a third distance between the first contact portion and the third contact portion being shorter than the second distance between the second contact portion and the third contact portion, and a fourth distance between the second contact portion and the fourth contact portion being shorter than the first distance between the first contact portion and the fourth contact portion, wherein a straight line between points at which the first contact portion and the fourth contact portion contact the electronic element intersects another straight line between points at which the second contact portion and the third contact portion contact the electronic element.

6. An electronic component comprising:

an electronic element having first and second electrodes formed on opposite sides relative to each other, and a support elastically bracketing the electronic element having first and second contact portions in contact with different positions on the first electrode, respectively, and third and fourth contact portions in contact with different positions on the second electrode, respectively, a first distance between the first and fourth contact portions being longer than a second distance between the second and third contact portions, the first and fourth contact portions being electrically connected to the first and second electrodes, respectively, to form a conductive path to the electronic element, the second and third contact portions being in contact with the first and second electrodes in the electrically insulated state, respectively; and a third distance between the first contact portion and the third contact portion being shorter than the second distance between the second contact portion and the third contact portion, and a fourth distance between the second contact portion and the fourth contact portion being shorter than the first distance between the first contact portion and the fourth contact portion, wherein the electronic element is suspended at only four separate points defined by locations at which the first, second, third and fourth contact portions contact the electronic element.

* * * * *